United States Patent
Jak et al.

(10) Patent No.: US 11,300,883 B2
(45) Date of Patent: Apr. 12, 2022

(54) METHOD TO DETERMINE A PATTERNING PROCESS PARAMETER

(71) Applicant: ASML Netherlands B.V., Veldhoven (NL)

(72) Inventors: Martin Jacobus Johan Jak, 's-Hertogenbosch (NL); Simon Gijsbert Josephus Mathijssen, Rosmalen (NL); Kaustuve Bhattacharyya, Veldhoven (NL); Won-Jae Jang, Gyeonggi-do (KR); Jinmoo Byun, Seoul (KR)

(73) Assignee: ASML Netherlands B.V., Veldhoven (NL)

( * ) Notice: Subject to any disclaimer, the term of this patent is extended or adjusted under 35 U.S.C. 154(b) by 651 days.

(21) Appl. No.: 16/135,197

(22) Filed: Sep. 19, 2018

(65) Prior Publication Data

US 2019/0094703 A1    Mar. 28, 2019

(30) Foreign Application Priority Data

Sep. 22, 2017 (EP) ..................................... 17192525
Jan. 12, 2018 (EP) ..................................... 18151420

(51) Int. Cl.
*G03F 7/20* (2006.01)

(52) U.S. Cl.
CPC .......... *G03F 7/70133* (2013.01); *G03F 7/705* (2013.01); *G03F 7/70091* (2013.01); *G03F 7/70575* (2013.01); *G03F 7/70633* (2013.01)

(58) Field of Classification Search
CPC .. G03F 7/70091; G03F 7/70133; G03F 7/705; G03F 7/70575; G03F 7/70633
See application file for complete search history.

(56) References Cited

U.S. PATENT DOCUMENTS

| 7,481,579 B2 | 1/2009 | Yokhin et al. |
| 7,652,776 B2 | 1/2010 | Shyu et al. |

(Continued)

FOREIGN PATENT DOCUMENTS

| CN | 101510051 A | 8/2009 |
| CN | 102636963 A | 8/2012 |

(Continued)

OTHER PUBLICATIONS

International Search Report and Written Opinion of the International Searching Authority directed to related International Patent Application No. PCT/EP2018/074575, dated Dec. 17, 2018; 11 pages.

(Continued)

*Primary Examiner* — Peter B Kim
(74) *Attorney, Agent, or Firm* — Sterne, Kessler, Goldstein & Fox P.L.L.C.

(57) ABSTRACT

A method to determine a patterning process parameter, the method comprising: for a target, calculating a first value for an intermediate parameter from data obtained by illuminating the target with radiation comprising a central wavelength; for the target, calculating a second value for the intermediate parameter from data obtained by illuminating the target with radiation comprising two different central wavelengths; and calculating a combined measurement for the patterning process parameter based on the first and second values for the intermediate parameter.

15 Claims, 18 Drawing Sheets

(56) References Cited

U.S. PATENT DOCUMENTS

| | | |
|---|---|---|
| 8,189,195 B2 | 5/2012 | Den Boef et al. |
| 9,223,227 B2 | 12/2015 | Bhattacharyya et al. |
| 9,535,338 B2 | 1/2017 | Jak et al. |
| 10,401,279 B2 | 9/2019 | Vukkadala et al. |
| 10,824,071 B2 * | 11/2020 | Lee ................. G03F 9/7088 |
| 2006/0066855 A1 | 3/2006 | Boef et al. |
| 2009/0296075 A1 | 12/2009 | Hu et al. |
| 2011/0027704 A1 | 2/2011 | Cramer et al. |
| 2011/0043791 A1 | 2/2011 | Smilde et al. |
| 2012/0242940 A1 | 9/2012 | Nagata et al. |
| 2016/0071255 A1 | 3/2016 | Lee et al. |
| 2016/0161864 A1 | 6/2016 | Middlebrooks et al. |
| 2017/0184981 A1 * | 6/2017 | Quintanilha ............ H05G 2/008 |
| 2018/0088470 A1 * | 3/2018 | Bhattacharyya .... G03F 7/70633 |

FOREIGN PATENT DOCUMENTS

| | | |
|---|---|---|
| EP | 1400855 A2 | 3/2004 |
| JP | 2009-038339 A | 2/2009 |
| JP | 2015-520859 A | 7/2015 |
| JP | 2016-538717 A | 12/2016 |
| TW | 1347428 B | 8/2011 |
| TW | 1421642 B | 1/2014 |
| TW | 1591782 B | 7/2017 |
| WO | WO 2009/078708 A1 | 6/2009 |
| WO | WO 2009/106279 A1 | 9/2009 |
| WO | WO 2011/012624 A1 | 2/2011 |
| WO | WO 2015/018625 A1 | 2/2015 |

OTHER PUBLICATIONS

International Preliminary Report on Patentability of the International Searching Authority directed to related International Patent Application No. PCT/EP2018/074575, dated Mar. 24, 2020; 6 pages.

* cited by examiner

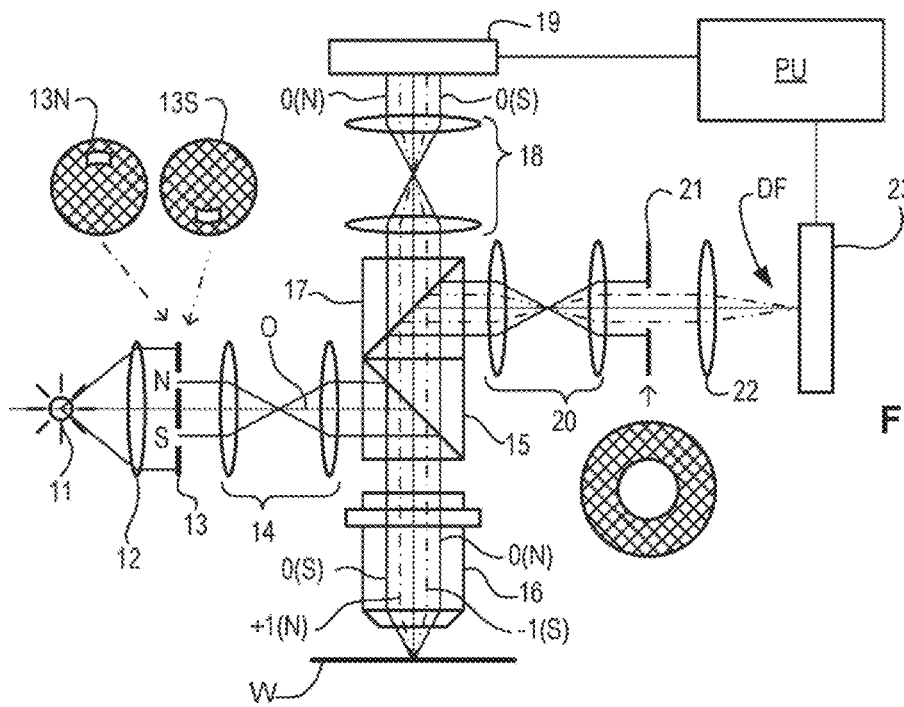
Fig. 7A
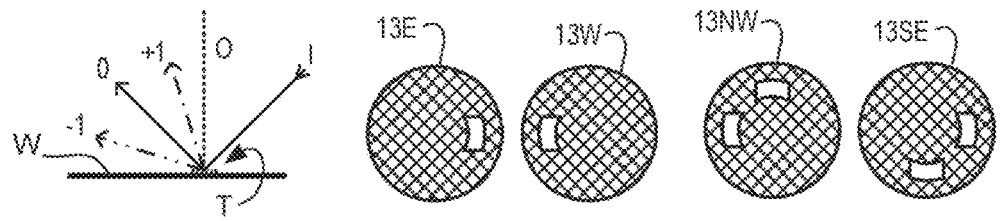
Fig. 7B  Fig. 7C  Fig. 7D
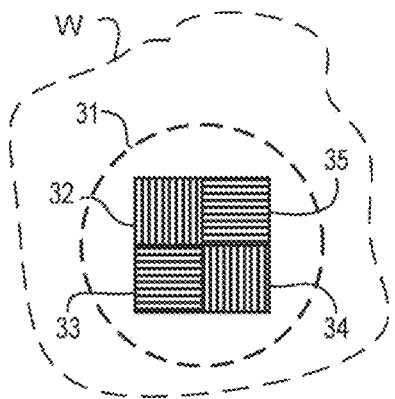 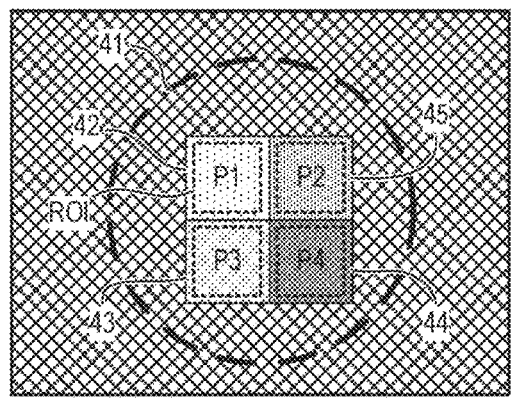
Fig. 8  Fig. 9

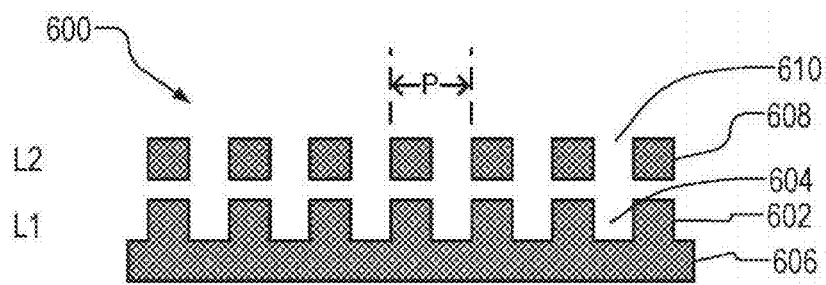
Fig. 11A
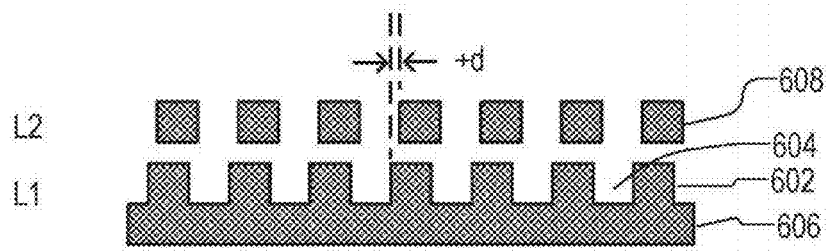
Fig. 11B
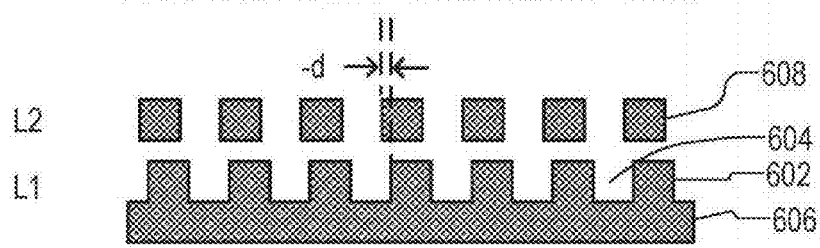
Fig. 11C
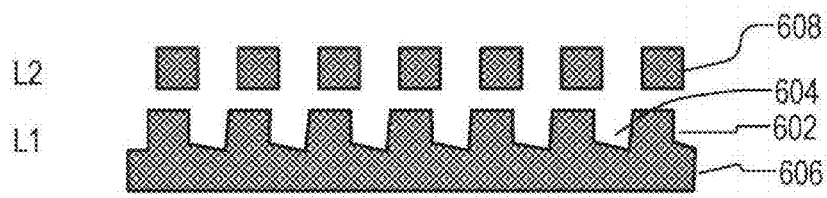
Fig. 11D

METHOD TO DETERMINE A PATTERNING PROCESS PARAMETER

FIELD

The present disclosure relates to a method to determine a patterning process parameter, a metrology apparatus, a non-transitory computer program product and a system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup the apparatus in the patterning process for transferring the pattern onto the substrates, develop one or more metrology targets to monitor the process, setup up a metrology process to measure the metrology targets and then implement a process of monitoring and/or controlling the process based on measurements.

So, in a patterning process, it is desirable to determine (e.g., measure, simulate using one or more models that model one or more aspects of the patterning process, etc.) one or more parameters of interest, such as the critical dimension (CD) of a structure, the overlay error between successive layers (i.e., the undesired and unintentional misalignment of successive layers) formed in or on the substrate, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. These devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A further technique is involves having the zeroth order of diffraction (corresponding to a specular reflection) blocked, and only higher orders are processed. Examples of such metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Such diffraction-based techniques are typically used to measure overlay. The targets for techniques can be smaller than the illumination spot and may be surrounded by product structures on a substrate. A target can comprise multiple periodic structures, which can be measured in one image. In a particular form of such a metrology technique, overlay measurement results are obtained by measuring a target twice under certain conditions, while either rotating the target or changing the illumination mode or imaging mode to obtain separately a normal (e.g., $+1^{st}$) and a complementary (e.g., $-1^{st}$) diffraction order intensities. The intensity asymmetry, a comparison of these diffraction order intensities, for a given target provides a measurement of target asymmetry, that is asymmetry in the target. This asymmetry in the target can be used as an indicator of overlay error.

In the example of overlay measurement, the techniques above rely on an assumption that overlay (i.e., overlay error and deliberate bias) is the only cause of target asymmetry in the target. Any other asymmetry in the target or the measurement, such as structural asymmetry of features within the periodic structure in an upper and/or lower layer, an asymmetry in the measurement using the sensor, etc., can also cause a measured intensity asymmetry in the $1^{st}$ (or other higher) orders. This intensity asymmetry attributable to such other asymmetry in the target and/or measurement, and which is not related to overlay (including an intentional bias), perturbs the overlay measurement, giving an inaccurate overlay measurement.

There can be a significant variance in the results of a measurement at a particular measurement radiation wavelength. Different measurement results can yield very different overlay results if it is assumed that there is no feature asymmetry effect. It is possible to use measurements taken from two different measurement radiation wavelengths so that the overlay measurement is more robust to any feature asymmetry effect. However, in some cases measurements that use different measurement radiation wavelengths suffer from more noise than measurements made with a single measurement radiation wavelength.

SUMMARY

It is desirable to improve the accuracy of determining a patterning process parameter, such as overlay. It is desirable to reduce the impact of noise on the determination of a patterning process parameter. It is desirable to improve reproducibility of a determination of a patterning process parameter.

In an embodiment, there is provided a method to determine a patterning process parameter, the method comprising: for a target, calculating a first value for an intermediate parameter from data obtained by illuminating the target with radiation comprising a central wavelength; for the target, calculating a second value for the intermediate parameter from data obtained by illuminating the target with radiation comprising two different central wavelengths; and calculating a combined measurement for the patterning process parameter based on the first and second values for the intermediate parameter.

In an embodiment, there is provided a method to determine a patterning process parameter, the method comprising: for each of a plurality of targets across a layer of a substrate, calculating a measurement for the patterning process parameter, wherein for at least one of the targets the measurement is calculated from data obtained by illuminating the target with radiation comprising a central wavelength, and for at least one other of the targets the measurement is calculated from data obtained by illuminating the target with radiation comprising two different central wavelengths.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 7A depicts a schematic diagram of an inspection apparatus (e.g., a dark field scatterometer in this case) configured to measure a target using a first pair of illumination apertures;

FIG. 7B schematically depicts a detail of a diffraction spectrum of a target periodic structure for a given direction of illumination;

FIG. 7C schematically depicts a second pair of illumination apertures providing further illumination modes in using the inspection apparatus of FIG. 7A for diffraction based overlay measurements;

FIG. 7D schematically depicts a third pair of illumination apertures combining the first and second pair of apertures;

FIG. 8 depicts a form of multiple periodic structure target and an outline of a measurement spot on a substrate;

FIG. 9 depicts an image of the target of FIG. 8 obtained in the inspection apparatus of FIG. 7A;

FIG. 11A, FIG. 11B and FIG. 11C respectively show schematic cross-sections of overlay periodic structures having different overlay values in the region of zero;

FIG. 11D is a schematic cross-section of an overlay periodic structure having structural asymmetry in a bottom periodic structure due to processing effects;

DETAILED DESCRIPTION

Before describing embodiments in detail, it is instructive to present an example environment in which embodiments may be implemented.

Figure 1:
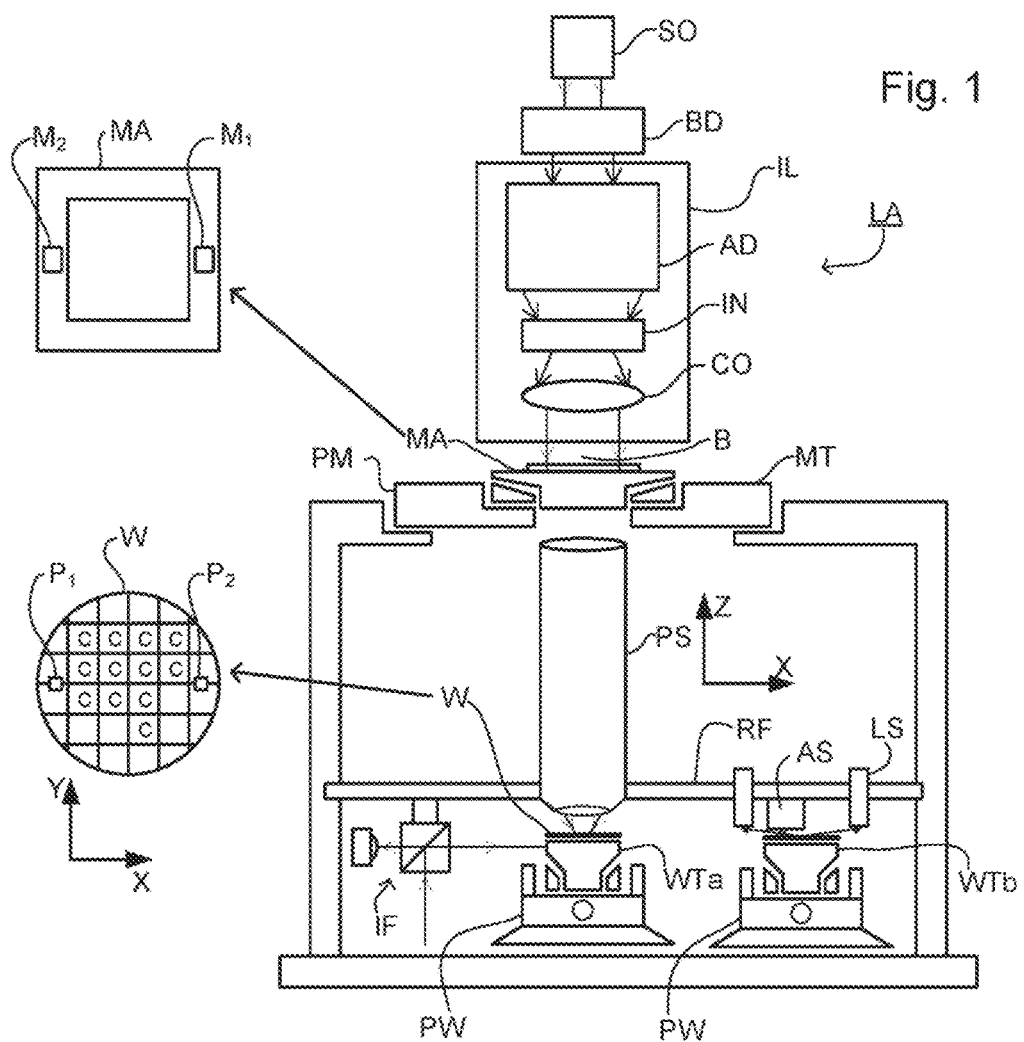
FIG. 1 depicts an embodiment of a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters, and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
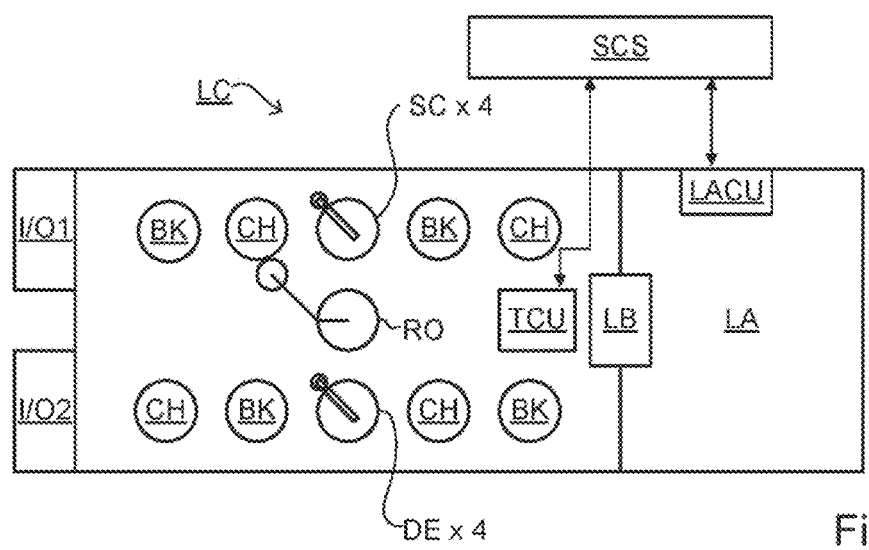
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to design, monitor, control, etc. the patterning process (e.g., a device manufacturing process) that includes at least one patterning step (e.g., an optical lithography step), the patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection.

Figure 3:
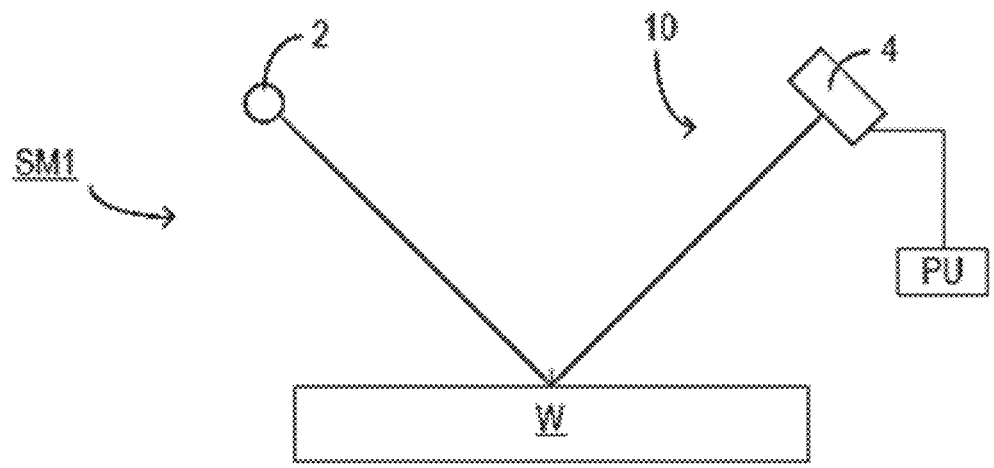
FIG. 3 schematically depicts an example inspection apparatus and metrology technique.
Figure 3:
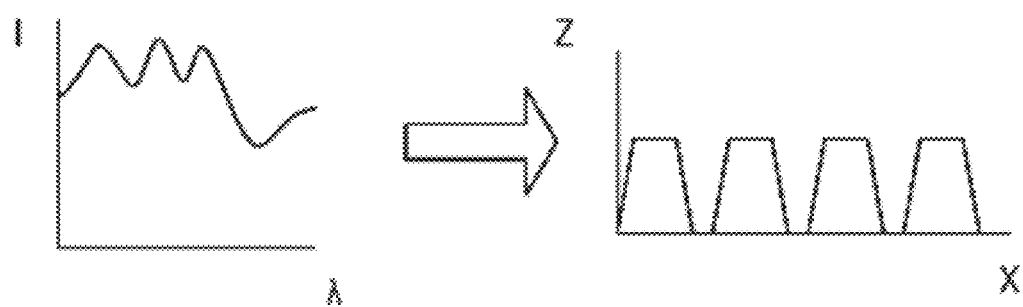

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
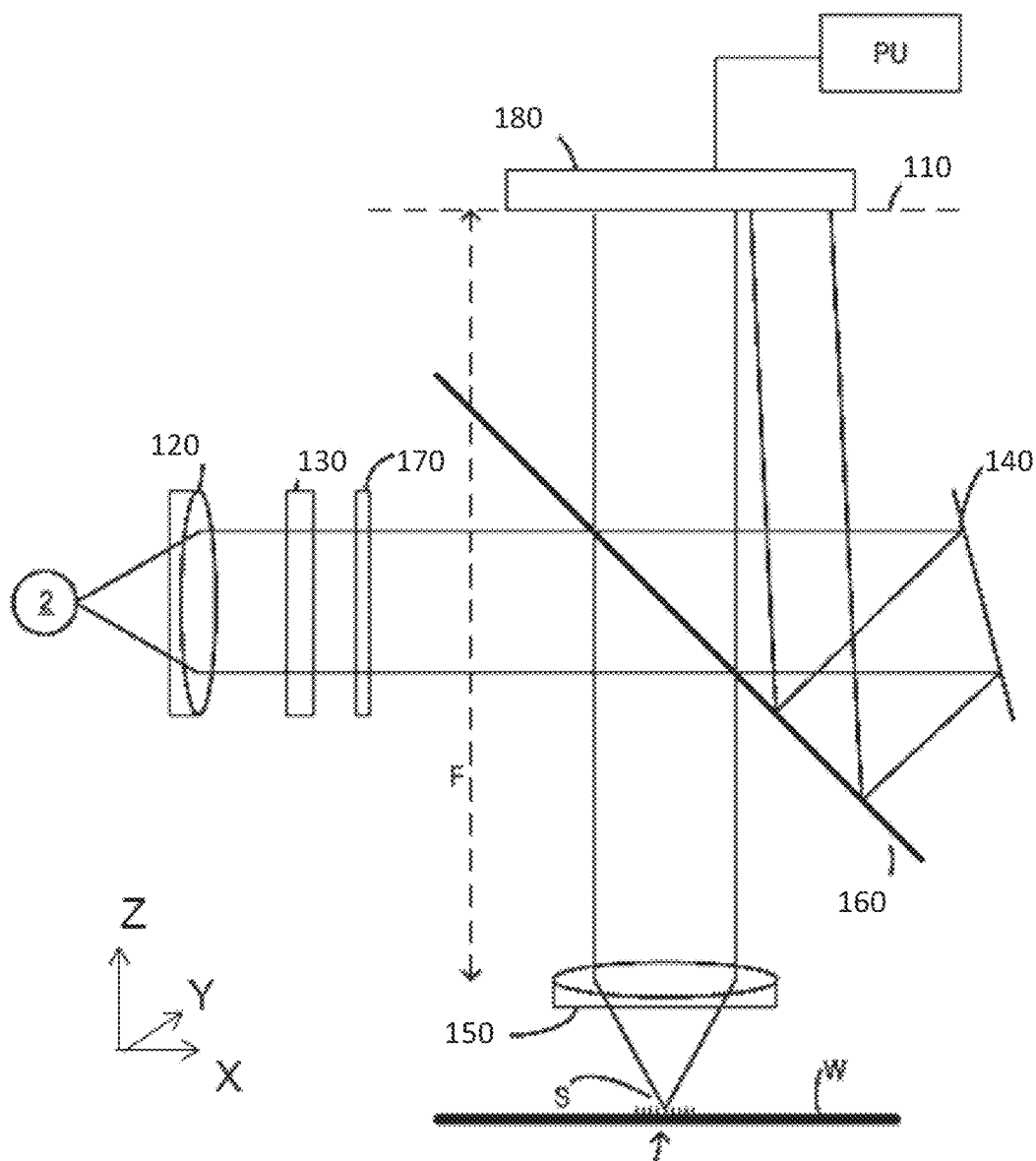
FIG. 4 schematically depicts an example inspection apparatus.

Another inspection apparatus that may be used is shown in FIG. 4. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 150. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference mirror 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the −1st and +1$^{st}$ orders in the diffraction spectrum of a periodic structure). The concepts of asymmetry measurement using the instrument of FIG. 3 or FIG. 4 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

Figure 5:
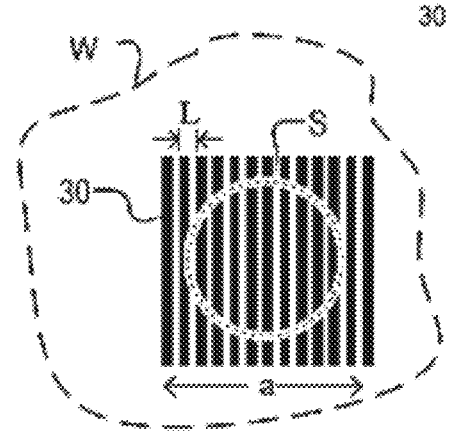
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

Figure 6:
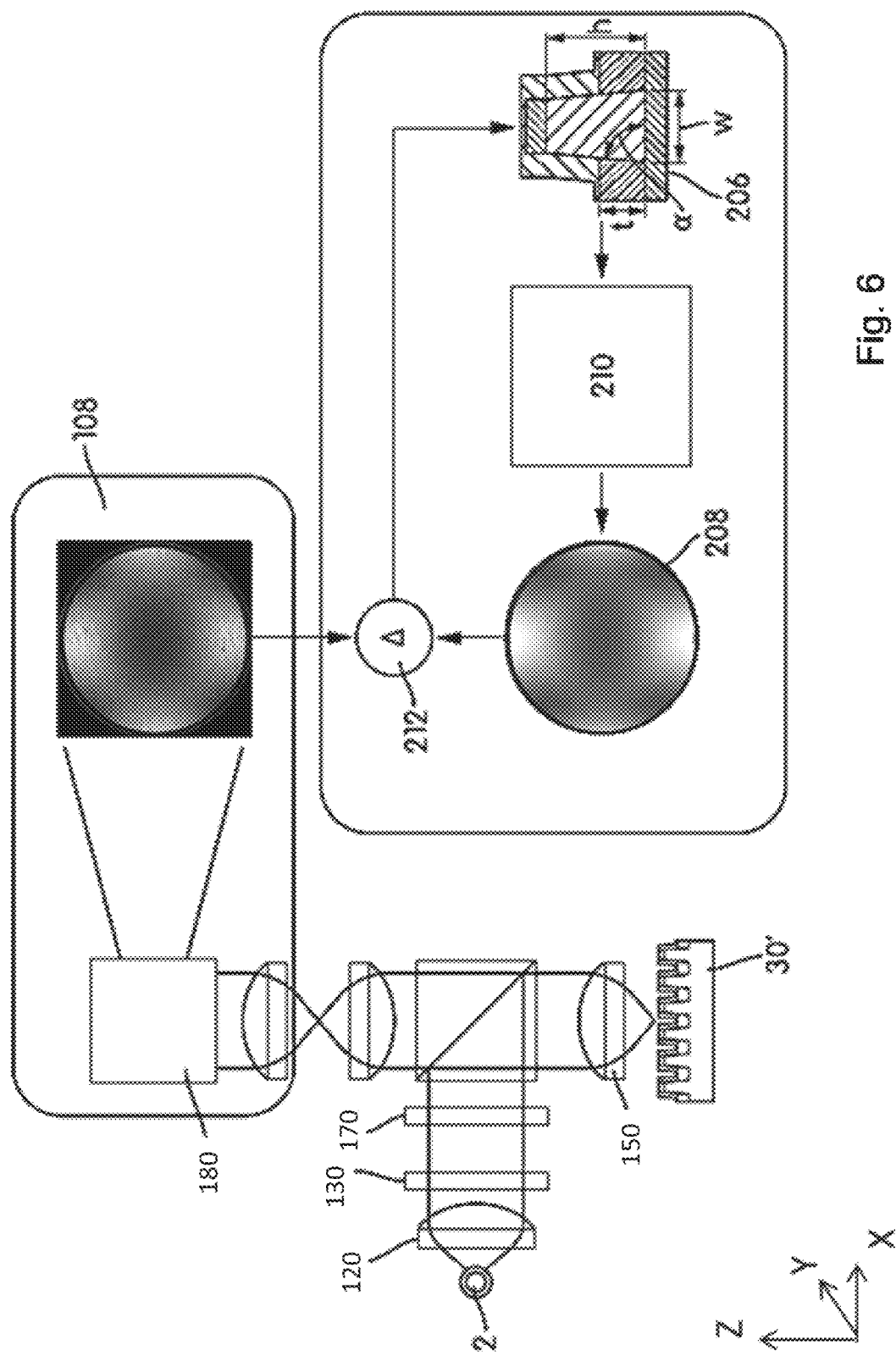
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 180 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

A further inspection apparatus suitable for use in embodiments is shown in FIG. 7A. A target T and diffracted rays of measurement radiation used to illuminate the target are illustrated in more detail in FIG. 7B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

As shown in FIG. 7B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 7A and 7B are shown somewhat off axis, purely to enable them to be more easily distinguished in the diagram.

At least the 0 and $+1^{st}$ orders diffracted by the target T on substrate W are collected by objective lens 16 and directed back through optical element 15. Returning to FIG. 7A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the $-1^{st}$ and $+1^{st}$ orders is present.

The particular forms of aperture plate 13 and field stop 21 shown in FIGS. 7A, 7C and 7D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 7A, 7B, 7C or 7D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the setup). For measurement of an orthogonal periodic structure, rotation of the target through 90° and 270° might be implemented. Different aperture plates are shown in FIGS. 7C and 7D. The use of these, and numerous other variations and applications of the apparatus are described in the patent application publications mentioned above.

FIG. 8 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semi-conductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 8. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

FIG. 9 shows an example of an image that may be formed on and detected by the sensor 23, using the target of FIG. 8 in the apparatus of FIG. 7, using the aperture plates 13NW or 13SE from FIG. 7D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 10:
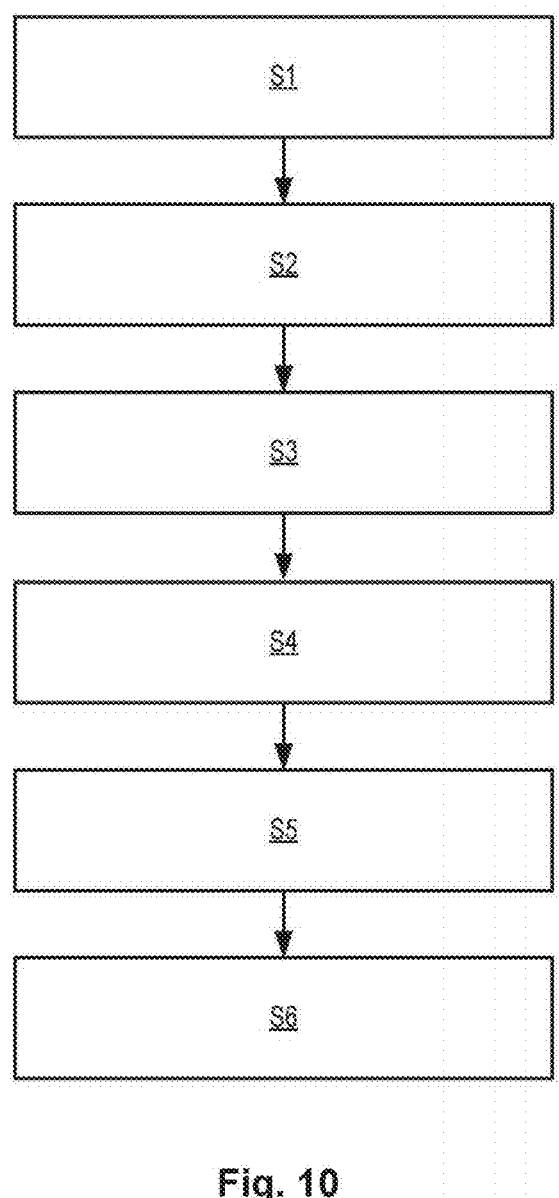
FIG. 10 is a flowchart showing steps of an overlay measurement method using the inspection apparatus of FIG. 3.

FIG. 10 illustrates how, using for example the method described in PCT patent application publication no. WO 2011/012624 (incorporated herein in its entirety by reference), overlay error (i.e., undesired and unintentional overlay misalignment) between the two layers containing the component periodic structures 32 to 35 is measured. This measurement is done through identifying target asymmetry, as revealed by comparing the intensities in the normal and complementary diffraction order images of the target periodic structures to obtain a measure of the intensity asymmetry. In an embodiment, the normal diffraction order is +1st order radiation and the complementary diffraction order is −1st order radiation. While the discussion herein focuses the normal diffraction order as being +1st order radiation and the complementary diffraction order being −1st order radiation, the intensities of other corresponding higher orders can be compared, e.g. +2nd and −2nd orders.

At step S1, the substrate, for example a semiconductor wafer, is processed through a lithographic apparatus, such as the lithographic cell of FIG. 2, one or more times, to create a target including the periodic structures 32-35. At S2, using the inspection apparatus of FIG. 7, an image of the periodic structures 32 to 35 is obtained using only one of the first order diffracted beams (say +1 order). At step S3, whether by changing the illumination mode, or changing the imaging mode, or by rotating substrate W by 180° in the field of view of the inspection apparatus, a second image of the periodic structures using the other first order diffracted beam (−1 order) can be obtained. Consequently the −1 order diffracted radiation is captured in the second image.

Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level. In step S4, a region of interest (ROI) is identified within the image of each component target periodic structure, from which intensity levels will be measured.

Having identified the ROI for each individual target periodic structure and measured its intensity, the asymmetry of the target, and hence overlay error, can then be determined. This is done (e.g., by the processor PU) in step S5 comparing the intensity values obtained for the normal and complementary diffraction order radiation for each target periodic structure 32-35 to identify their intensity asymmetry, e.g., any difference in their intensity. The term "difference" is not intended to refer only to subtraction. Differences may be calculated in ratio form. In step S6 the measured intensity asymmetries for a number of target periodic structures are used, together with knowledge of any known imposed overlay biases of those target periodic structures, to calculate one or more performance parameters of the patterning process in the vicinity of the target T.

FIGS. 11A-11D show schematic cross sections of target periodic structures (overlay periodic structures), with different bias offsets. These can be used as the target T on substrate W, as seen in FIGS. 7-9. Periodic structures with periodicity in the X direction are shown for the sake of example only. Different combinations of these periodic structures with different biases and with different orientations can be provided separately or as part of a target.

Starting with FIG. 11A, a target 600 formed in at least two layers, labeled L1 and L2, is shown. In the lower or bottom layer L1, a first periodic structure (the lower or bottom periodic structure), for example a grating, is formed by features 602 and spaces 604 on a substrate 606. In layer L2, a second periodic structure, for example a grating, is formed by features 608 and spaces 610. (The cross-section is drawn such that the features 602, 608 (e.g., lines) extend into the page.) The periodic structure pattern repeats with a pitch P in both layers. Features 602 and 608 may take the form of lines, dots, blocks and via holes. In the situation shown at FIG. 11A, there is no overlay contribution due to misalignment, e.g., no overlay error and no imposed bias, so that each feature 608 of the second structure lies exactly over a feature 602 in the first structure.

At FIG. 11B, the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At FIG. 11C, another feature with a second known imposed bias −d, such that the features of 608 are shifted to the left, is depicted. The value of d need not be the same for each structure. Biased periodic structures of this type shown at FIGS. 11A to 11C are described in the prior patent application publications mentioned above.

Figure 11E:
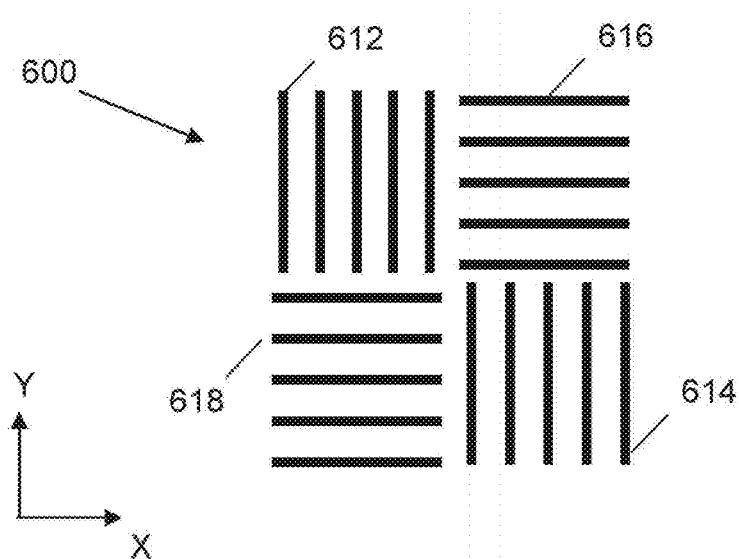
FIG. 11E is a schematic top view of an overlay target having periodic structures with intentional bias.

FIG. 11E schematically depicts, from the top, an example target 600 having sub-targets 612, 614, 616 and 618 comprising periodic structures in upper and lower layers such as depicted in FIGS. 11A to 11C. The lower layer is not shown in FIG. 11E. In an embodiment, the sub-targets 612, 614, 616 and 618 are designed to measure overlay in two perpendicular directions (e.g., X and Y) and have an imposed bias d to facilitate that (as described above in respect of FIGS. 11B and 11C). While the embodiment of FIG. 11E shows four sub-targets, there can be a different number and they can all be used to measure overlay in 1 direction or to measurement overlay in more than 2 directions.

In an embodiment, sub-targets 612 and 614 are designed to together measure overlay in the X-direction. In an embodiment, sub-target 612 has a bias of +d, while sub-target 614 has a bias of −d. In an embodiment, sub-targets 616 and 618 are designed to together measure overlay in the Y-direction. In an embodiment, sub-target 616 has a bias of +d, while sub-target 618 has a bias of −d.

Figure 11F:
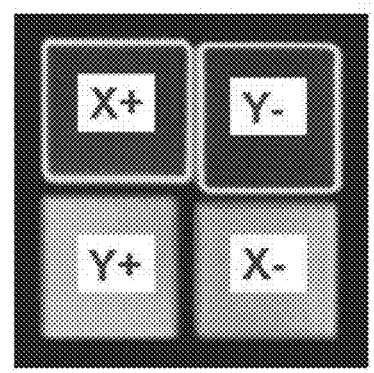
FIG. 11F depicts an example of a detected diffraction signal of a particular order radiation from a target such as depicted in FIG. 11E.
Figure 11G:
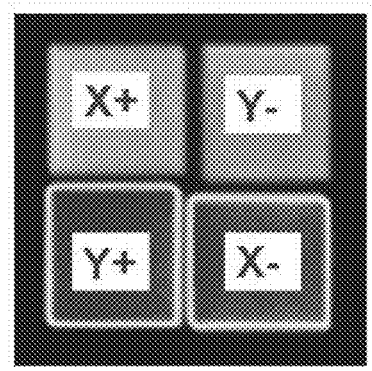
FIG. 11G depicts an example of a detected diffraction signal of another particular order radiation from a target such as depicted in FIG. 11E.

FIG. 11F depicts an example of a detected diffraction signal of the normal (e.g., +1st) order radiation from step S2 of a target 600 such as depicted in FIG. 11E. FIG. 11G depicts an example of a detected diffraction signal of the complementary (e.g., −1st) order radiation from step S3 of a target 600 such as depicted in FIG. 11E. For each periodic structure direction (X and Y) there are two periodic structures with opposite directions of intentional bias shown in FIGS. 11F and 11G by "+" (for +d bias) and "−" (for −d bias). So, X+ represents a detected diffraction signal from sub-target 612, X− represents a detected diffraction signal from sub-target 614, Y+ represents a detected diffraction signal from sub-target 618 and Y− represents a detected diffraction signal from sub-target 616. Thus, four diffraction intensity signals are detected per each periodic structure periodicity direction.

Figure 11H:
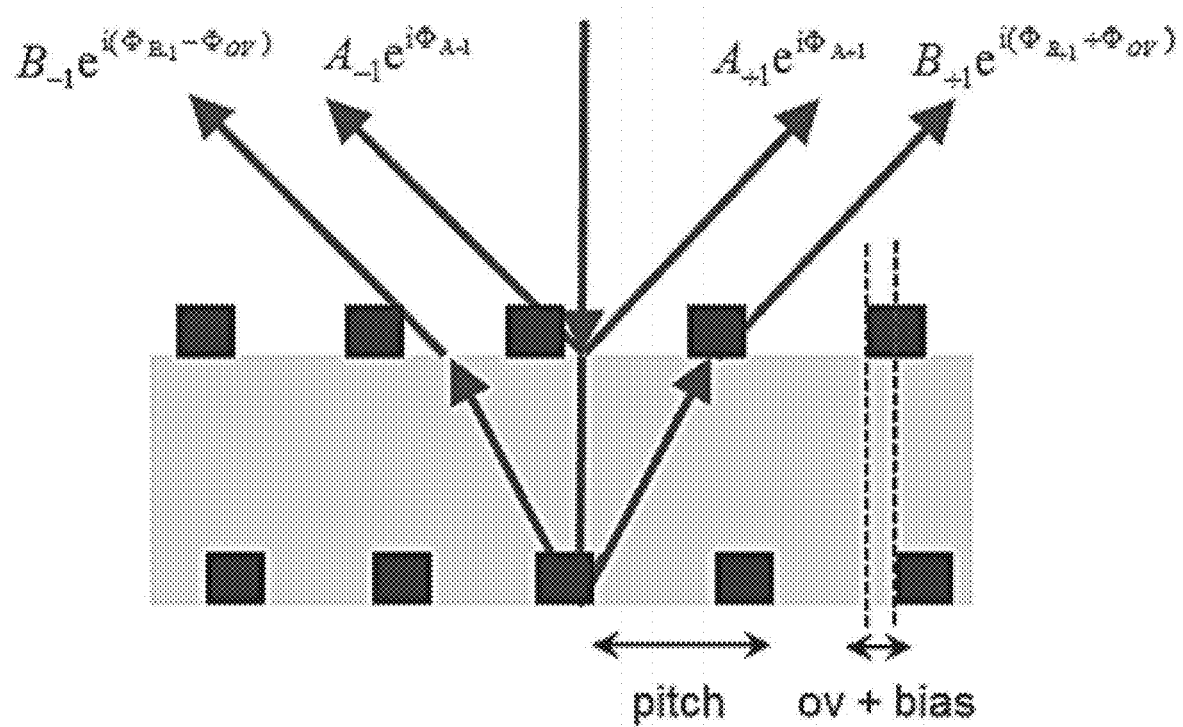
FIG. 11H is schematic depiction of a simple model for describing diffraction of radiation from a target with a two-layer periodic structure.

FIG. 11H is schematic depiction of a simple model for describing diffraction of radiation from a target (such as a sub-target 612, 614, 616 or 618) with a two-layer periodic structure (such as shown in FIGS. 11A to 11C). The complex amplitude of diffracted radiation from the upper layer and lower layer are shown. Diffracted radiation from the lower layer includes a phase contribution from overlay.

Figure 12:
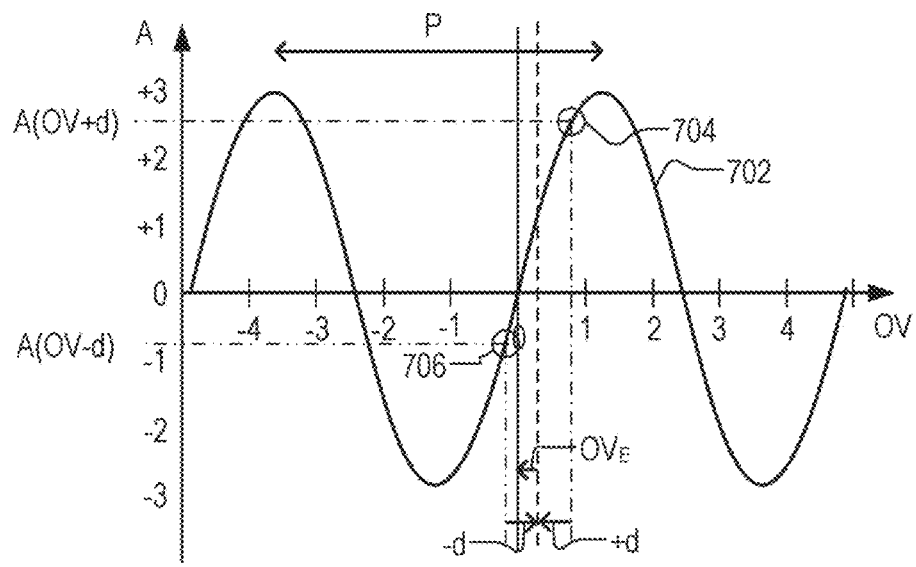
FIG. 12 illustrates principles of overlay measurement in an ideal target, not subject to structural asymmetry.
Figure 13:
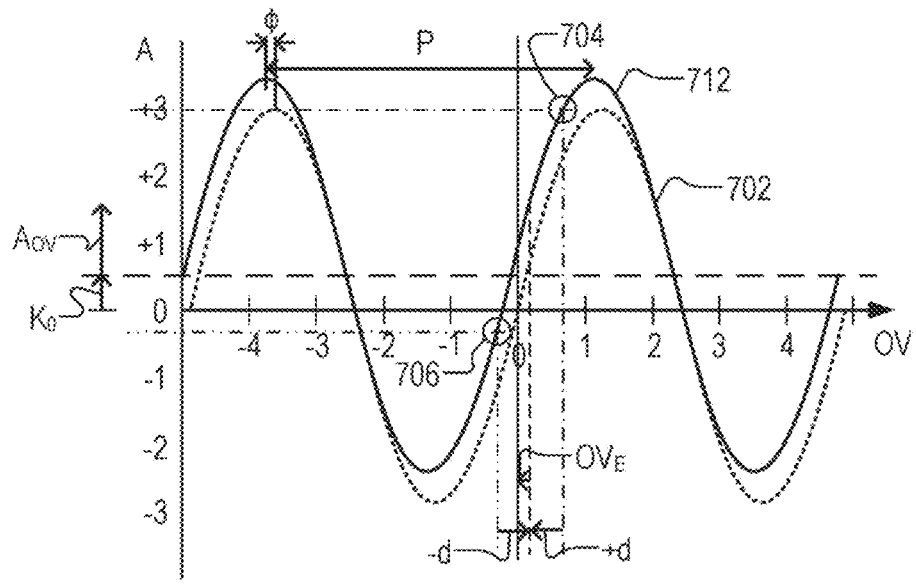
FIG. 13 illustrates principles of overlay measurement in a non-ideal target, with correction of structural asymmetry as disclosed in embodiments herein.

In FIG. 12 a curve 702 illustrates the relationship between overlay OV and intensity asymmetry A (e.g., the difference between the intensity of the +1st and −1st diffraction order intensity) for an 'ideal' target having zero offset and no structural asymmetry within the individual periodic structures forming the target, and in particular within the individual periodic structure of the first structure. Consequently, the target asymmetry of this ideal target comprises only an overlay contribution due to misalignment of the first structure and second structure resultant from a known imposed bias and overlay error OVE. This graph, and the graph of FIG. 13, illustrate the principles behind the disclosure only, and in each graph, the units of intensity asymmetry A and overlay OV are arbitrary. Examples of actual dimensions will be given further below.

In the 'ideal' situation of FIG. 12, the curve 702 indicates that the intensity asymmetry A has a non-linear periodic relationship (e.g., sinusoidal relationship) with the overlay. The period P of the sinusoidal variation corresponds to the period or pitch P of the periodic structures, converted of course to an appropriate scale. The sinusoidal form is pure in this example, but can include harmonics in real circumstances.

As mentioned above, biased periodic structures (having a known imposed overlay bias) can be used to measure overlay, rather than relying on a single measurement. This bias has a known value defined in the patterning device (e.g. a reticle) from which it was made, that serves as an on-substrate calibration of the overlay corresponding to the measured intensity asymmetry. In the drawing, the calculation is illustrated graphically. In steps S1-S5, intensity asymmetry measurements A+d and A-d are obtained for periodic structures having imposed biases +d and −d respectively (as shown in FIG. 11B and FIG. 11C, for example). Fitting these measurements to the sinusoidal curve gives points 704 and 706 as shown. Knowing the biases, the true overlay error OVE can be calculated. The pitch P of the sinusoidal curve is known from the design of the target. The vertical scale of the curve 702 is not known to start with, but is an unknown factor which can be referred to as a 1st harmonic proportionality constant, K. Thus, overlay sensitivity K is a measure of the sensitivity of the intensity asymmetry measurements to overlay. In an embodiment, it is a proportionality of the measured intensity with respect to overlay. It thus helps detect process dependency of overlay.

In equation terms, the relationship between overlay error $OV_E$ and intensity asymmetry A is assumed to be:

$$A_{\pm d} = K \sin(OV_E \pm d) \quad (1)$$

where overlay error OVE is expressed on a scale such that the target pitch P corresponds to an angle $2\pi$ radians. Using two measurements of periodic structures with different, known biases (e.g. +d and −d), the overlay error OVE can be calculated using:

$$OV_E = \operatorname{atan}\left(\frac{A_{+d} + A_{-d}}{A_{+d} - A_{-d}} \cdot \tan(d)\right) \quad (2)$$

Referring back to FIG. 11H, the overlay OV (also referred to overlay error $OV_E$) can also be evaluated as follows. Specifically, based on the model represented in FIG. 11H, the intensities of the +1$^{st}$ and −1$^{st}$ order of diffracted radiation can be calculated as follows:

$$I_{+1} = \left|A_{+1}e^{i\Phi_{A+1}} + B_{+1}e^{i(\Phi_{B+1}+\Phi_{OV})}\right|^2 = \quad (3)$$
$$A_{+1}^2 + B_{+1}^2 + 2A_{+1}B_{+1} \times \cos[\Phi_{A+1} - \Phi_{B+1} - \Phi_{OV}]$$

$$I_{-1} = \left|A_{-1}e^{i\Phi_{A-1}} + B_{-1}e^{i(\Phi_{B-1}-\Phi_{OV})}\right|^2 =$$
$$A_{-1}^2 + B_{-1}^2 + 2A_{-1}B_{-1} \times \cos[\Phi_{A-1} - \Phi_{B-1} + \Phi_{OV}]$$

where $$\Phi_{OV} = \frac{2\pi}{P}(OV \pm d)$$

is the phase difference due to overlay and bias and $$\Phi_A - \Phi_B = \beta \propto 4\pi \frac{T}{\lambda}$$

is the rest of the phase difference between diffracted radiation from upper and lower layers, which is proportional to the thickness T of the layer between the upper and lower periodic structures and inversely proportional to the wavelength of the incident radiation.

For convenience, the four intensities of one periodic structure direction (e.g. X) can be designated as follows:
PBN (+1st diffraction order from positive bias periodic structure)

PBC (−1st diffraction order from positive bias periodic structure)

NBN (+1st diffraction order from negative bias periodic structure)

NBC (−1st diffraction order from negative bias periodic structure)

So, ΔIPB can be designated as PBN-PBC and ΔINB can be designated as NBN-NBC. Then, with the assumption that the amplitude and phase (excluding overlay phase) of diffracted waves from the +1st and −1st order radiation and also from positive bias and negative bias periodic structures are equal, and the optics of the metrology device is symmetric itself, a difference between intensity of +1st and −1st order radiation is derived as $\Delta I = K \cdot \sin(\Phi_{OV})$, with K being overlay proportionality equal to $K = 4A \cdot B \cdot \sin(\beta)$. Hence, the overlay can be calculated as follows:

$$OV = \frac{P}{2\pi}\tan^{-1}\left(\tan\left(\frac{2\pi d}{P}\right) \cdot \frac{\Delta I_{PB} + \Delta I_{NB}}{\Delta I_{PB} - \Delta I_{NB}}\right) \quad (4)$$

Now, FIG. 11D shows schematically a phenomenon of structural asymmetry, in this case structural asymmetry in the first structure (lower or bottom structure asymmetry). The features in the periodic structures at FIGS. 11A to 11C, are shown as perfectly square-sided, when a real feature would have some slope on the side, and a certain roughness. Nevertheless they are intended to be at least symmetrical in profile. The features 602 and/or spaces 604 at FIG. 11D in the first structure no longer have a symmetrical form at all, but rather have become distorted by one or more processing steps. Thus, for example, a bottom surface of each space has become tilted (bottom wall tilt). For example, side wall angles of the features and spaces have become asymmetrical. As a result of this, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 10 using only two biased periodic structures, the process-induced structural asymmetry cannot be distinguished from the overlay contribution due to misalignment, and overlay measurements (in particular to measure the undesired overlay error) become unreliable as a result. Structural asymmetry in the first structure (bottom periodic structure) of a target is a common form of structural asymmetry. It may originate, for example, in the substrate processing steps such as chemical-mechanical polishing (CMP), performed after the first structure was originally formed.

FIG. 13 shows a first effect of introducing structural asymmetry, for example the bottom periodic structure asymmetry illustrated in FIG. 11D. The 'ideal' sinusoidal curve 702 no longer applies. However, at least approximately, bottom periodic structure asymmetry or other structural asymmetry has the effect of adding an intensity shift term K0 and a phase shift term φ to the intensity asymmetry $A_{\pm d}$. The resulting curve is shown as 712 in the diagram, with label K0 indicating the intensity shift term, and label φ indicating the phase offset term. The intensity shift term K0 and phase shift term φ are dependent upon a combination of the target and a selected characteristic of the measurement radiation, such as the wavelength and/or polarization of the measurement radiation, and is sensitive to process variations. In equation terms, the relationship used for calculation in step S6 becomes:

$$A_{\pm d} = K_0 + K\sin(OV_E \pm d + \phi) \quad (5)$$

Where there is structural asymmetry, the overlay model described by equation (2) will provide overlay error values which are impacted by the intensity shift term K0 and phase shift term φ, and will be inaccurate as a consequence. The structural asymmetry will also result in differences in measurements of the same target using one or more different measurement parameters (e.g., wavelength of the measurement beam, polarization of the measurement beam, etc.), when mapping the overlay error, because intensity and phase shift are, e.g., wavelength and/or polarization dependent.

The overlay calculations of modified step S6 rely on certain assumptions. Firstly, it is assumed intensity asymmetry behaves as a sine function of the overlay, with the period P corresponding to the periodic structure pitch. These assumptions are valid for present overlay ranges. The number of harmonics can be designed to be small, because the small pitch-wavelength ratio only allows for a small number of propagating diffraction orders from the periodic structure. However, in practice the overlay contribution to the intensity asymmetry due to misalignment may not necessarily be truly sinusoidal, and may not necessarily be completely symmetrical about OV=0.

So, the effect of structural asymmetry can be generally formulated as:

$$\Delta I_+ = K(O+d) + \Delta I_B \quad (6)$$

$$\Delta I_- = K(O-d) + \Delta I_B \quad (7)$$

where ΔI− (also synonymous with A−) and ΔI+ (also synonymous with A+) represent the intensity asymmetry measured for the negatively biased and positively biased periodic structures respectively and ΔIBG is the contribution to the intensity asymmetry of the structural asymmetry. And so, the overlay error ΔOV can be considered as a function of ΔIBG/K.

Now, it has been further discovered that, in addition to or alternatively to structural asymmetry in a target, a stack difference between adjacent periodic structures of a target or between adjacent targets may be a factor that adversely affects the accuracy of measurement, such as overlay measurement. Stack difference may be understood as an undesigned difference in physical configurations between adjacent periodic structures or targets. Stack difference causes a difference in an optical property (e.g., intensity, polarization, etc.) of measurement radiation between the adjacent periodic structures or targets that is due to other than overlay error, other than intentional bias and other than structural asymmetry common to the adjacent periodic structures or targets. Stack difference includes, but is not limited to, a thickness difference between the adjacent periodic structures or targets (e.g., a difference in thickness of one or more layers such that one periodic structure or target is higher or lower than another periodic structure or target designed to be at a substantially equal level), a refractive index difference between the adjacent periodic structures or targets (e.g., a difference in refractive index of one or more layers such that the combined refractive index for the one or more layers for one periodic structure or target is different than the combined refractive index for the one or more layers for of another periodic structure or target even though designed to have a substantially equal combined refractive index), a difference in material between the adjacent periodic structures or targets (e.g., a difference in the material type, material uniformity, etc. of one or more layers such that there is a difference in material for one periodic structure or target from another periodic structure or target designed to have a substantially same material), a difference in the periodic structure period of the structures of adjacent periodic structures or targets (e.g., a difference in the periodic structure period for one periodic structure or target from another periodic structure or target designed to have a substantially same periodic structure period), a difference in depth of the structures of adjacent periodic structures or targets (e.g., a difference due to etching in the depth of structures of one periodic structure or target from another periodic structure or target designed to have a substantially same depth), a difference in width (CD) of the features of adjacent periodic structures or targets (e.g., a difference in the width of features of one periodic structure or target from another periodic structure or target designed to have a substantially same width of features), etc. In some examples, the stack difference is introduced by processing steps, such as CMP, layer deposition, etching, etc. in the patterning process. In an embodiment, periodic structures or targets are adjacent if within 200 µm of each other, within 150 µm of each other, within 100 µm of each other, within 75 µm of each other, within 50 µm of each other, within 40 µm of each other, within 30 µm of each other, within 20 µm of each other, or within 10 µm of each other.

The effect of stack difference (which can be referred to as grating imbalance between gratings) can be generally formulated as:

$$\Delta I_+ = (K+\Delta K)(OV+d) \quad (8)$$

$$\Delta I_- = (K-\Delta K)(OV-d) \quad (9)$$

wherein $\Delta K$ represents a difference in the overlay sensitivity attributable to the stack difference. And so, the overlay error $\Delta OV$ can be proportional to $$\frac{\Delta K}{K}d.$$

So, in order to characterize the stack difference, one or more stack difference parameters can be defined. As noted above, a stack difference parameter is a measure of the un-designed different physical configuration of the adjacent periodic structures or targets. In an embodiment, the stack difference parameter can be determined from evaluating cross-sections of the adjacent periodic structures or targets.

In an embodiment, the stack difference parameter can be determined for lower adjacent periodic structures of a composite periodic structure by evaluating the lower adjacent periodic structures before the upper periodic structures are applied. In an embodiment, the stack difference parameter can be derived from a reconstruction of the adjacent periodic structures or targets from optical measurements of the adjacent periodic structures or targets or from cross-sections of the adjacent periodic structures or targets. That is, the physical dimensions, characteristics, materials properties, etc. are reconstructed and the differences between the adjacent periodic structures or targets are determined to arrive at a stack difference parameter.

An embodiment of the stack difference parameter is a periodic structure intensity imbalance (GI) which can be defined as:

$$GI = 2 * \frac{\hat{I}^{+d} - \hat{I}^{-d}}{\hat{I}^{+d} + \hat{I}^{-d}} \quad (10)$$

where $\hat{I}^{+d}$ is the average of the +1st diffraction order intensity signal diffracted by a first periodic structure having a +d bias, $I_{+1}{}^{+d}$, and −1st diffraction order intensity signal diffracted by the first periodic structure having the +d bias, $I_{-1}{}^{+d}$. Similarly, $\hat{I}^{-d}$ is the average of the +1st diffraction order intensity signal diffracted by a second periodic structure having a −d bias, $I_{+1}{}^{-d}$, and −1st diffraction order intensity signal diffracted by the second periodic structure having the −d bias, $I_{-1}{}^{-d}$. In an embodiment, the periodic structure intensity imbalance (GI) can be a derived version, such as $$\frac{\hat{I}^{+d} - \hat{I}^{-d}}{\hat{I}^{+d} + \hat{I}^{-d}}, \frac{\hat{I}^{+d} + \hat{I}^{-d}}{\hat{I}^{+d} - \hat{I}^{-d}},$$

Further, the measurement accuracy and/or sensitivity of a target may vary with respect to one or more attributes of the target itself and/or one or more attributes of the measurement radiation provided onto the target, for example, the wavelength of the radiation, the polarization of the radiation, and/or the intensity distribution (i.e., angular or spatial intensity distribution) of the radiation. In an embodiment, the wavelength range of the radiation is limited to one or more wavelengths selected from a range (e.g., selected from the range of about 400 nm to 900 nm). Further, a selection of different polarizations of the radiation beam (e.g., TE polarized radiation and TM polarized radiation) may be provided and various illumination shapes can be provided using, for example, a plurality of different apertures.

So, to enable such selection and measurement, a metrology recipe can be used that specifies one or more parameters of the measurement using the measurement system. In an embodiment, the term "metrology recipe" includes one or more parameters of the measurement itself, one or more parameters of a pattern of the target measured, or both.

In this context, a pattern of the target measured (also referred to as a "target" or "target structure") may be a pattern that is optically measured, e.g., whose diffraction is measured. The target pattern measured may be a pattern specially designed or selected for measurement purposes. Multiple copies of a target may be placed on many places on a substrate.

In an embodiment, if the metrology recipe comprises one or more parameters of the measurement itself, the one or more parameters of the measurement itself can include one or more parameters relating to a measurement beam and/or measurement apparatus used to make the measurement. For example, if the measurement used in a metrology recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or a number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In an embodiment, if the metrology recipe comprises one or more parameters of a pattern measured, the one or more parameters of the pattern measured may include one or more geometric characteristics (such as a shape of at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a segmentation of a feature of the pattern (e.g., a division of a feature of a periodic structure into sub-structures), and/or a length of a periodic structure or of a feature of the periodic structure), and/or a materials property (e.g., refractive index, extinction coefficient, material type, etc.) of at least part of the pattern, and/or an identification of the pattern (e.g., distinguishing a pattern being from another pattern), etc.

A metrology recipe may be expressed in a form like $(r_1, r_2, r_3 \ldots r_n; t_1, t_2, t_3 \ldots t_m)$, where $r_i$ are one or more parameters of the measurement and $t_j$ are one or more parameters of one or more patterns measured. As will be appreciated, n and m can be 1. Further, the metrology recipe does not need to have both one or more parameters of the measurement and one or more parameters of one or more patterns measured; it can have just one or more parameters of the measurement or have just one or more parameters of one or more patterns measured.

A target may be subjected to measurement using two metrology recipes A and B, e.g., differ on the stage at which a target is measured (e.g., A measures a target when it comprises a latent image structure and B measures a target when it doesn't comprise a latent image structure) and/or differ on the parameters of their measurement. Metrology recipes A and B can at least differ on the target measured (e.g., A measures a first target and B measures a second different target). Metrology recipes A and B may differ on the parameters of their measurement and target measurement. Metrology recipes A and B may not even be based on the same measurement technique. For example recipe A may be based on diffraction-based measurement and recipe B may be based on scanning electron microscope (SEM) or atomic force microscopy (AFM) measurement.

Now, as noted above, some techniques of determining overlay assume that a measured intensity asymmetry is proportional only to the actual overlay shift between periodic structure layers. However, this is not necessarily the case as the measured asymmetry is also affected by various feature asymmetry effects that occur in production of the periodic structures of the target, such as structural asymmetry, stack difference, etc. These feature asymmetry effects perturb the first order asymmetry-based overlay measurement and can result in a bias of the measurement, and therefore an inaccurate overlay measurement.

A technique to analyze overlay that aims to account for feature asymmetry effects such as structural asymmetry, stack difference, etc. involves a self-reference technique using A+ versus A− analysis described in PCT patent application publication no. WO 2015/018625 and U.S. patent application publication no. US 2016/0161864, which are incorporated herein in their entireties by reference.

In an embodiment, this involves an A+ versus A− analysis which comprises analyzing diffraction-based overlay measurements by determining the asymmetry A+ of the radiation (e.g., a difference between the positive 1st order radiation and the negative 1st order radiation) from a positively biased periodic structure (e.g., periodic structure 612) as a function of the asymmetry A− of the radiation (e.g., a difference between the positive 1st order radiation and the negative 1st order radiation) from a negatively biased periodic structure (e.g., periodic structure 614). In an embodiment, A+ and A− are determined for a number of different measured pupil pixels and/or a number of different wavelength-polarization combinations (i.e. for a number of different metrology recipes). From this data, a fit of a curve (e.g., a straight line) or a function (e.g., a function representing a curve, in particular a function representing a straight line) through the data is obtained. In an embodiment, the fitting is obtained by regression. In an embodiment, the fitting is obtained by linear regression. In an embodiment, from the curve or function, a measure of overlay can be determined (e.g., from the slope of a straight line or of an associated function for the straight line). The description herein will focus on curves (e.g., lines), but as will be appreciated additionally or alternatively a function (such as a function representing a curve such as a straight line) can be fitted through the data. The description herein will also focus on plots of A+ versus A−, but as will be appreciated plots of A+ versus A− data are not necessary to determine a fitted curve or function through the data.

Figure 14:
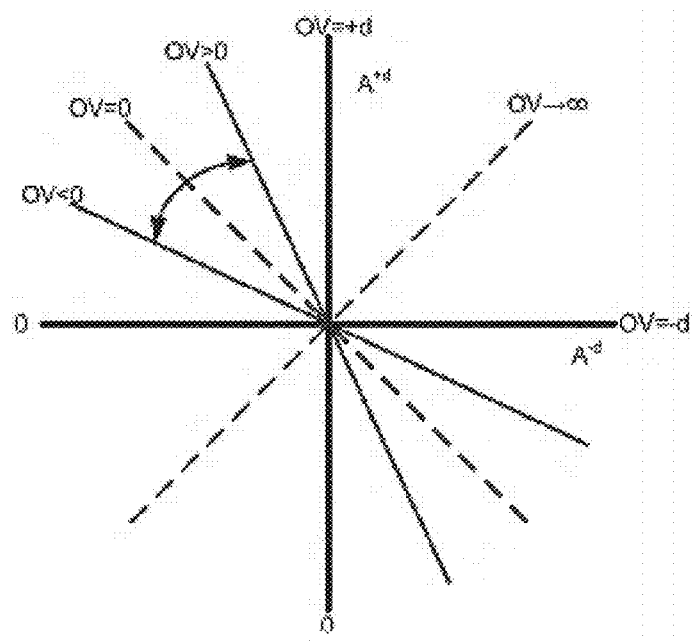
FIG. 14 is a plot of A+ versus A− for an overlay target that has no feature asymmetry effects according to an embodiment.

FIG. 14 is an example plot of A+ (marked as A+d) against A− (marked as A−d) for overlay periodic structures that have no feature asymmetry effect, such that the only asymmetry present in the radiation is the asymmetry due to the bias and overlay, to show an example of the fitting. In this case, the relation between A+ and A− lies on a curve, specifically a straight line, fitting through the origin (because no feature asymmetry effect is assumed). The corresponding A+ versus A− data points for all the metrology recipes lay on this line. The slope of this line (which is the fitting) is related to the actual overlay. FIG. 14 shows six example lines that occur depending on the nature of the data. The dotted line labelled OV=0 is a line indicating zero overlay and has a slope of −1. This line would occur where the overlay is zero. The dotted line labelled OV∞ is a line having a slope of +1 and is indicative of overlay approaching infinity. So, when there is an overlay error in the data, there would be, e.g., a solid line labelled OV<0, which is a line having a slope less than −1 and is indicative of overlay less than zero, or a solid line labelled OV>0, which is a line having a slope greater than −1 and is indicative of overlay greater than zero. Additionally, it can be seen that overlay equal to +d, where d is the periodic structure bias, would result in a plotted line along the y-axis; and overlay equal to −d would result in a plotted line along the x-axis.

Figure 15:
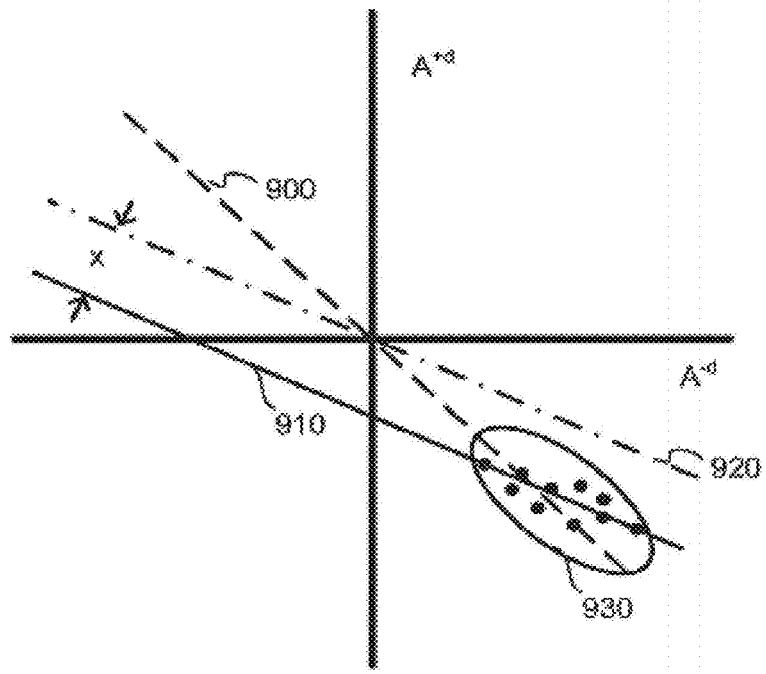
FIG. 15 is a plot of A+ against A− for an overlay target having a feature asymmetry effect according to an embodiment.

FIG. 15 is a plot of A+ against A− according to the techniques described above wherein the overlay target has a feature asymmetry effect. According to the techniques discussed above, wherein the overlay target has no feature asymmetry effect, the data points 930 would be fitted with a line 900 through the origin. However, in this embodiment, the data points are fitted according to a best fit method (for example, least squares) by a line 910 not necessarily going through the origin. In this way the overlay can still be calculated from the slope of the line 910; but it can be seen that line 910 is parallel to a line 920 indicative of that which would be seen for the same measured structure having no feature asymmetry effect. The axis intercept of line 910, that is the offset of line 910 from line 920 (a line having the same slope as line 910, but plotted through the origin), indicates quantitatively the effect of the feature asymmetry effect.

So, fitting of a curve or function through A+ versus A− data by, e.g., regression can yield a more accurate value of overlay as it would be without a contribution attributable to feature asymmetry effects, by determination of the slope of a fitted line through the data set, the line not necessarily being fitted through the origin. Optionally, feature asymmetry effects could be determined via an offset of the fitted line from the origin (e.g., an intercept term).

Figure 16A:
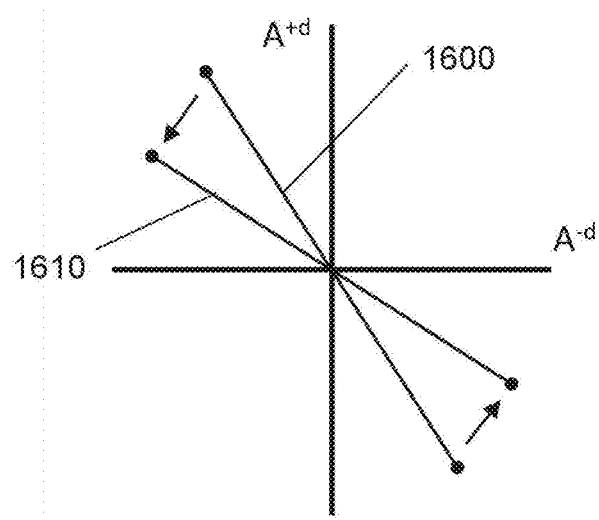
FIGS. 16A, 16B and 16C are plots of A+ against A− for an overlay target having various feature asymmetry effects (including no feature asymmetry effect) according to an embodiment.
Figure 16B:
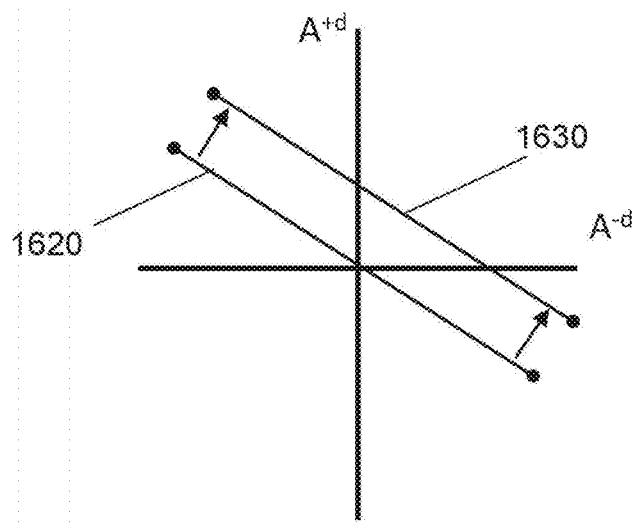
Figure 16C:
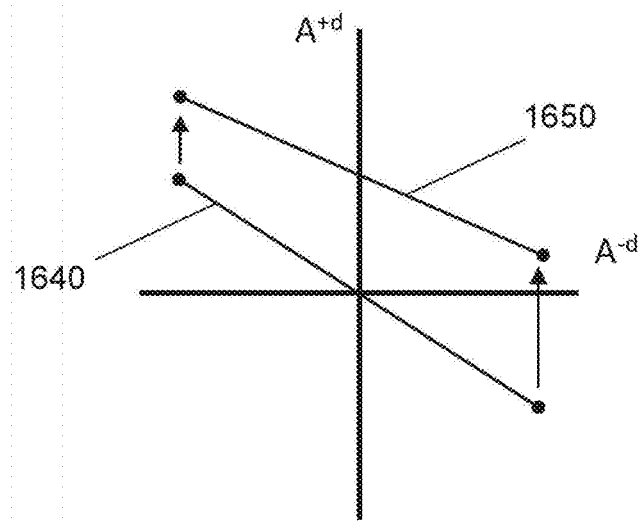

FIG. 16A-C are plots of A+ against A− demonstrating how the data shifts for various scenarios of feature asymmetry effect (including lack thereof). FIG. 16A is a plot of A+ against A− for an overlay target that has no feature asymmetry effect (e.g., no structural asymmetry and no stack difference). Line 1600 represents the data for the overlay target with a certain overlay and line 1610 represents the data for the overlay target with a different overlay. As discussed above, the slopes of the lines correspond to a magnitude of the overlay. So, the arrows show how the data, and thus the lines, are rotated depending on the magnitude of the overlay.

FIG. 16B is a plot of A+ against A− showing how the data is affected by, e.g., a structural asymmetry of an overlay target. Line 1620 represents the data for an overlay target with no feature asymmetry effect (and having a certain overlay). As discussed above, the line 1620 runs through the origin where there is no feature asymmetry effect. Now, line 1630 represents the data for the overlay target with a structural asymmetry (e.g., a bottom grating structural asymmetry) but having the same overlay. The structural asymmetry causes the data, and thus the line, to displace while retaining the same slope. So, the arrows show how the data, and thus the line 1630, is displaced depending on the magnitude of the structural asymmetry.

FIG. 16C is a plot of A+ against A− showing how the data is affected by, e.g., a stack difference of an overlay target. Line 1640 represents the data for an overlay target with no feature asymmetry effect (and having a certain overlay). As discussed above, the line 1640 runs through the origin where there is no feature asymmetry effect. Now, line 1650 represents the data for the overlay target with a stack difference but having the same overlay. The stack difference causes the data, and thus the line, to displace with different amounts. So, the arrows show how the data, and thus the line 1650, is displaced depending on the magnitude of the stack difference. Significantly, it can be seen the slope of the line is affected.

Figure 17A:
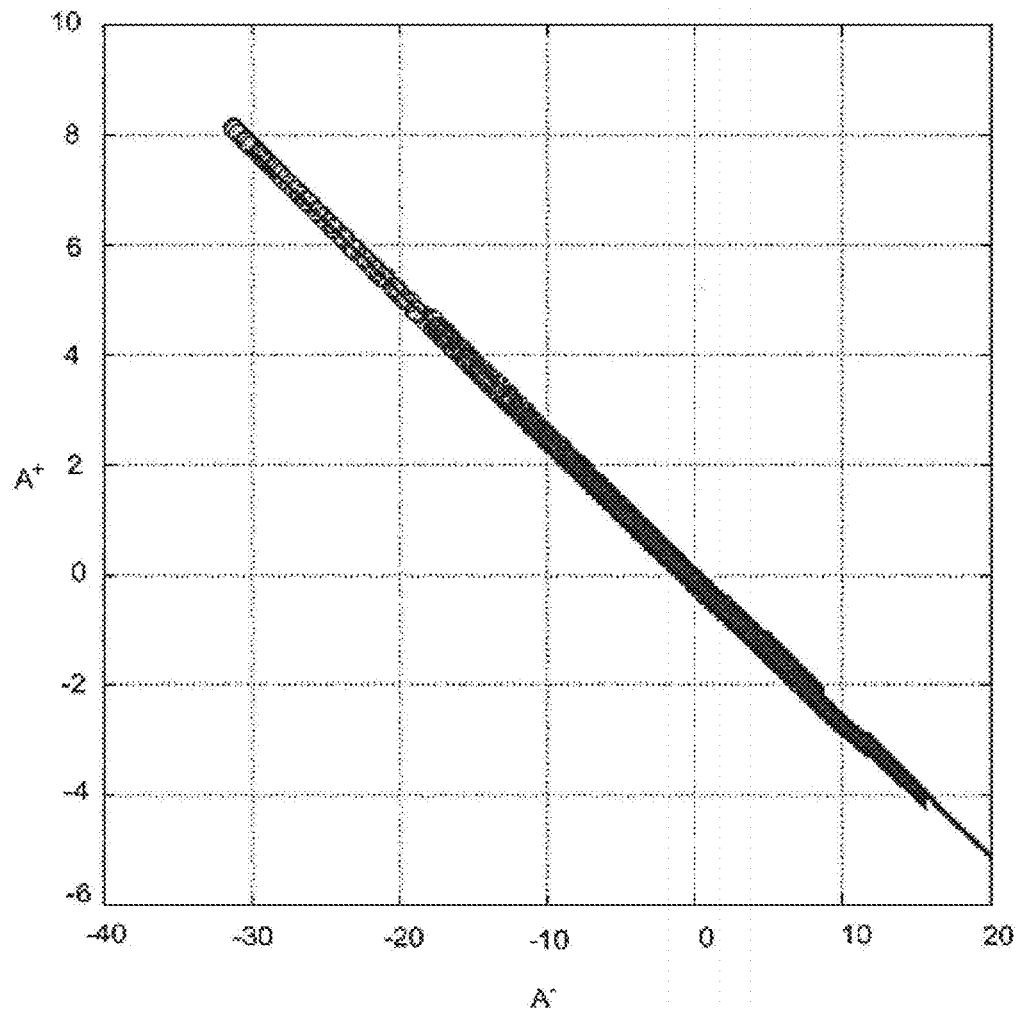
FIG. 17A is a plot of A+ against A− for an overlay target having no feature asymmetry effects according to an embodiment.
Figure 17B:
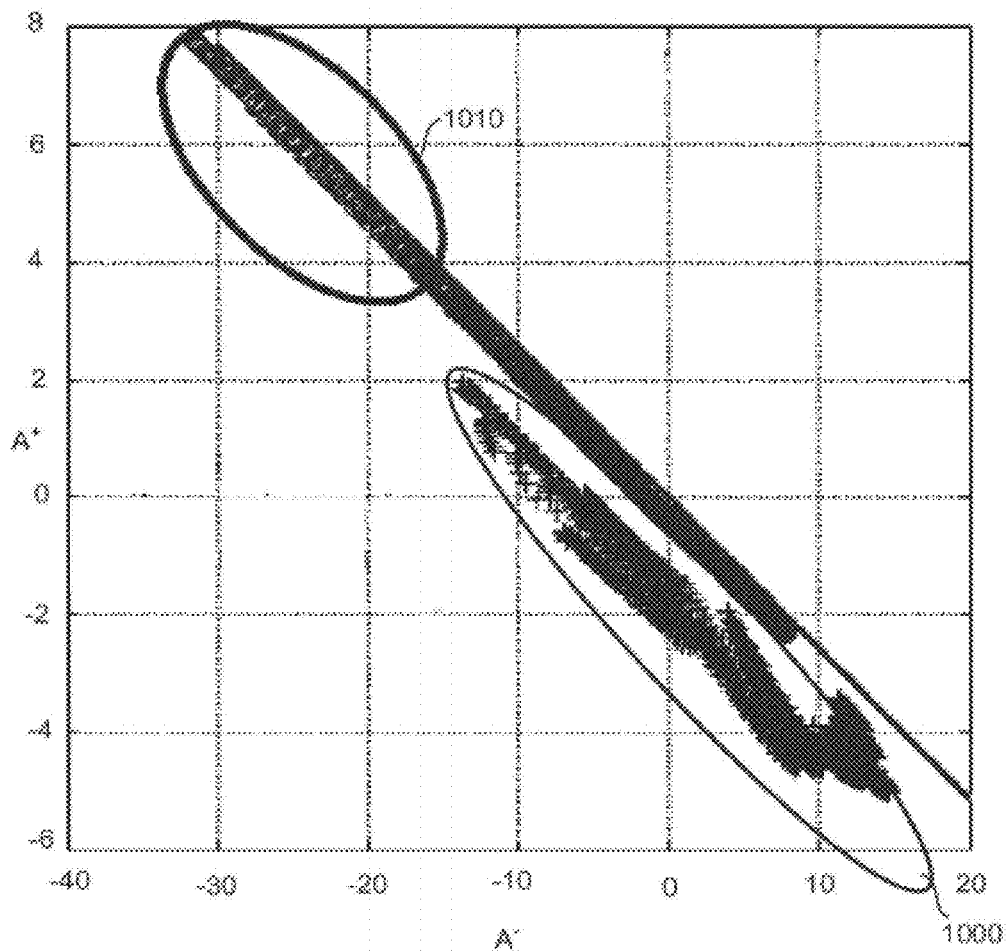
FIG. 17B is a plot of A+ against A− for an overlay target with feature asymmetry effects according to an embodiment.

FIG. 17A is a plot of A+ against A− for (simulated) data of different polarization-wavelength combinations, for an overlay target having no feature asymmetry effect. It can be seen that all the data fits on the same line, as already discussed. FIG. 17B shows a similar plot as that of FIG. 17A, but with a feature asymmetry effect present, specifically a 0.5 nm floor-tilt. In both FIGS. 17A and 17B, data marked by a circle represents TE radiation and data marked by a cross represents TM radiation. Although it cannot be seen here, position along the line is largely determined by wavelength (for a given polarization) such that shorter (violet) wavelengths tend to be found at the upper end of the line (A+=6 to 8), and the longer (red) wavelengths tend to be found at the lower end of the line.

From FIG. 17B it can be seen that wavelength- and polarization-dependent deviation from the linear relationship is observed in the region 1000 around the origin. Overlay sensitivity, in this example of a 0.5 nm floor-tilt, is smallest for TE polarization. Furthermore, data with the largest K-value (the proportionality factor between overlay and asymmetry in the measured radiation), i.e. the largest sensitivity to overlay, can also be easily identified, this being data 1010 which still shows a linear relationship farthest from the origin. The data 1010 in this example is for radiation in the short wavelength (violet) region. Consequently a plot such as this allows selection of an optimal metrology recipe which when used to measure a periodic structure, yields data 1010 most sensitive to overlay and least dependent on feature asymmetry effect.

In a practical metrology recipe optimization, a number of measurements over the substrate should be performed for different wavelengths and polarizations, such that all possible feature asymmetry effects on the substrate (e.g. at the edge) are considered. Once an optimum or desired recipe is selected, the measurements can be performed with this single recipe (e.g., wavelength-polarization-illumination angle combination).

If no single metrology recipe is providing sufficient feature asymmetry effect robustness, it may be possible to identify a combination of 2 or 3 metrology recipes using the A+ versus A− analysis explained above. This may be the case where each individual metrology recipe yields a cloud of data entries, and the line through 2 to 3 metrology recipes shows a non-zero axis cut-off; the slope of such a line would still yield overlay data that is relatively robust to feature asymmetry effects. To do this, 2 or 3 metrology recipes are used for the actual overlay measurements.

So, in an embodiment, the A+ versus A− analysis can be used to evaluate metrology recipes for a target having a periodic structure with a positive bias (A+) and a periodic structure with a negative bias (A−). So, for overlay as the performance parameter, A+ and A− is determined for each of the metrology recipes and the determined values of A+ are evaluated against the determined values of A− to yield a fitting through such data. A value related to that fitting corresponds to a more accurate value of the actual overlay for an instance of the target. For example, the slope of the line provides a measure of the overlay. Accordingly, in a calibration routine, with a set, known overlay, the metrology recipe that yields a slope value of its fitting at or close to the set, known overlay is a strong candidate to be the metrology recipe for high volume measurement.

Figure 18:
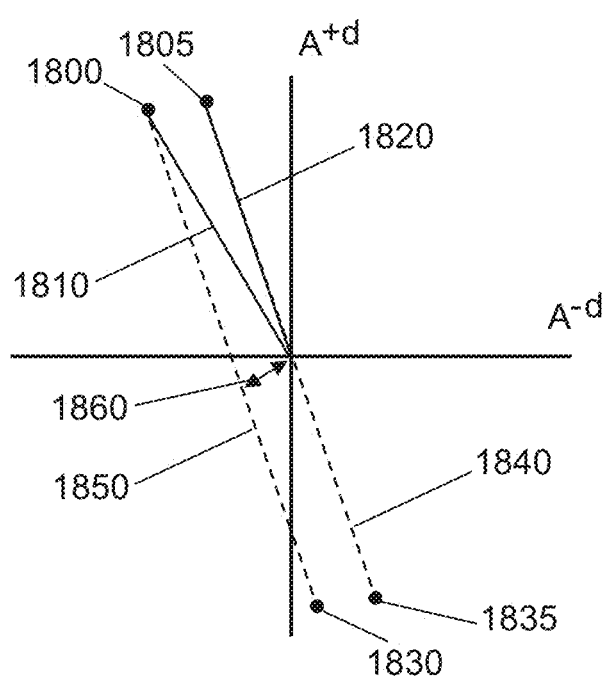
FIG. 18 is a plot of A+ against A− for an instance of an overlay target having no feature asymmetry effect and an instance of an overlay target having a feature asymmetry effect, according to an embodiment.

Referring to FIG. 18, there can be a significant variance in the results of measurement at a particular metrology recipe. For example, two example measurement results 1800, 1805 are shown in the plot of A+ against A− in FIG. 18 for a particular single metrology recipe (e.g., particular measurement radiation wavelength). In this case, each of the measurement results is associated with a same overlay but is of a different instance of a certain target. As shown by the slopes of the solid lines 1810, 1820, each measurement result 1800, 1805 would yield a very different overlay if it is assumed that there is no feature asymmetry effect (i.e., the lines pass through the origin). In fact, the instance of the target corresponding to measurement result 1800 has a significant feature asymmetry effect (e.g. structural asymmetry), while the instance of the target corresponding to measurement result 1805 does not. So, it can be seen that when a significant feature asymmetry effect (e.g., structural asymmetry, stack difference, etc.) is present, a single metrology recipe (e.g., a single wavelength) may give an error to the determined overlay, specifically the overlay as determined from measurement result 1800.

However, using measurements taken from multiple different metrology recipes (e.g., two different metrology recipes), the overlay can be determined more accurately as it is more robust to feature asymmetry effect. Referring to FIG. 18 again, two further example measurement results 1830, 1835 are shown in the plot of A+ against A− in FIG. 18 for a particular second metrology recipe (e.g., particular measurement radiation wavelength) that is different from the first metrology recipe for results 1800, 1805. As with measurements 1800, 1805, in this case, each of the measurement results 1830, 1835 is associated with a same overlay but is of a different instance of a certain target. The measurement result 1830 is of a same instance of the target as measurement result 1800 and the measurement result 1835 is of a same instance of the target as measurement 1805. As noted above, in fact, the instance of the target corresponding to measurement results 1800, 1830 has a significant feature asymmetry effect (e.g. structural asymmetry), while the instance of the target corresponding to measurement results 1805, 1835 does not.

But now, as shown by the slopes of the dotted lines 1840, 1850, the combination of measurement results 1800, 1805, 1830, 1835 would yield a substantially same overlay irrespective of the feature asymmetry effect. So, it can be seen that even with a significant feature asymmetry effect (e.g., structural asymmetry, stack difference, etc.) indicated by the distance 1860 of the line 1850 from the origin, two or more metrology recipes (e.g., a plurality of wavelengths) can yield a determined overlay that is fairly robust to feature asymmetry effect.

So, in an embodiment, two or more different metrology recipes are selected by which an instance of a target is measured and from which combination of results an overlay is determined that is robust to possible feature asymmetry effect for the instance of the target. That is, in an embodiment, there is provided a technique to choose an appropriate metrology recipe combination which can be used to provide an overlay result that is relatively to feature asymmetry effects or other sources of spurious intensity asymmetry (stack difference, structural asymmetry, etc.).

By selecting two or more different metrology recipes (e.g. two different wavelengths), the determination of patterning process parameters such as overlay is more robust to any feature asymmetry effect. However, in some cases the use of two or more different metrology recipes results in more noise compared to using a single metrology recipe.

Figure 19:
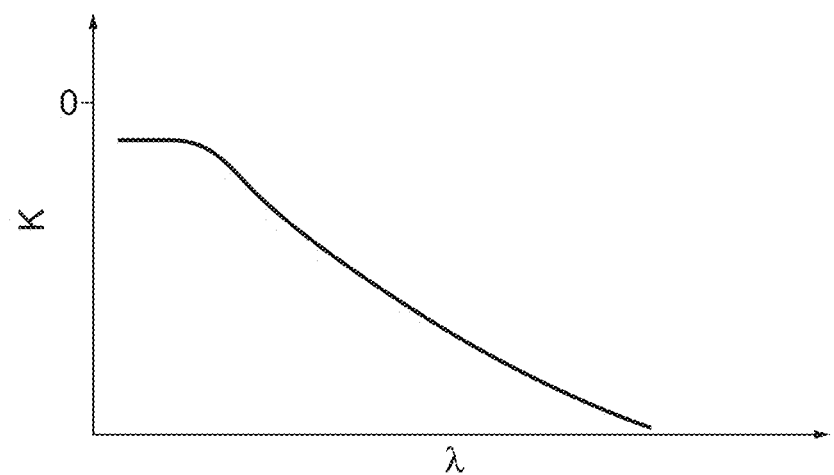
FIG. 19 is a graph showing the relationship between measurement radiation wavelength and overlay sensitivity.

FIG. 19 is a graph showing the relationship between measurement radiation wavelength (along the x axis) and overlay sensitivity K (along the y axis). In the measurement of overlay, the intensity asymmetry is equal to the product of the overlay sensitivity and the overlay. The intensity asymmetry is the difference in intensity between the +1 and −1 diffraction orders reflected from the target. The overlay sensitivity is a measure of the sensitivity of the intensity asymmetry measurements to overlay.

As is exemplified in FIG. 19, the overlay sensitivity can vary depending on the measurement radiation wavelength used. It is desirable for the magnitude of the overlay sensitivity to be large in order to improve the accuracy of the overlay measurement. When the magnitude of the overlay sensitivity is large, the overlay can be measured more accurately. In the asymmetry graph of the type shown in FIG. 18, it is desirable for the two measurement results used to determine the overlay to be far from each other. When the two measurement results are far from each other, the overlay can be measured more accurately.

In the example shown in FIG. 18, the measurement results 1800, 1805, 1830, 1835 are relatively far from the origin because the magnitude of the overlay sensitivity is relatively large. If the overlay sensitivity had been lower for those measurements, then the measurement results would have been closer to the origin in the asymmetry graph of FIG. 18.

Meanwhile, in the example shown in FIG. 18, the measurement result 1800 is on the opposite side of the origin from the further measurement result 1830. Similarly, the measurement result 1805 is on the opposite side of the origin from the further result 1835. This is desirable because it is desirable for the two measurement results (e.g. measurement results 1800 and 1830, or measurement results 1805 and 1835) to be far from each other in the asymmetry graph of FIG. 18. This leads to more accurate measurements of overlay. One way to achieve this is to choose the measurement radiation wavelengths for the two measurement results such that they have oppositely signed overlay sensitivity values that have a large magnitude. For example, the measurement radiation wavelength for the measurement result 1800 may be selected so that the overlay sensitivity is large and positive. Meanwhile, the measurement radiation wavelength for the measurement result 1830 may be selected such that the overlay sensitivity is large and negative.

However, it is not always possible to select such desirable measurement radiation wavelengths. For example, this would not be possible when the relationship between the measurement radiation wavelength and the overlay sensitivity is as shown in FIG. 19. As shown in the example of FIG. 19, the overlay sensitivity is always negative for the whole range of possible measurement radiation wavelengths. If two measurement radiation wavelengths are selected that have similar overlay sensitivity values, then the two measurement results may be close to each other in the asymmetry graph of FIG. 18. This could reduce the accuracy of the overlay measurement because any inaccuracies in the measurement results would have a greater influence on the measured overlay.

One option would be to select one measurement radiation wavelength that provides a large and negative overlay sensitivity, and a second measurement radiation wavelength that gives an overlay sensitivity that is close to zero. This could result in one measurement result being desirably far from the origin in the asymmetry graph of FIG. 18. However, the measurement result from the measurement radiation wavelength that gives a small overlay sensitivity would be close to the origin in the asymmetry graph of FIG. 18. Both measurement results have some inaccuracy (i.e. noise) associated with them.

When one of the measurement results is very close to the origin (e.g. because the overlay sensitivity is very small), then the overlay measurement that is based on two different measurement radiation wavelengths can be less accurate than an overlay measurement based on a single measurement radiation wavelength. This is because when a single measurement radiation wavelength is used, the overlay measurement is derived from the single measurement result (which may be from the origin) and the origin itself. The origin is free from noise and so provides no undesirable contribution to the inaccuracy of the overlay measurement. Alternatively, when two different measurement radiation wavelengths are used and one of the measurement results is very close to the origin, then the measurement result that is close to the origin effectively increases the noise compared to the situation where the origin is used (i.e. when only a single measurement radiation wavelength is used).

Hence, in some cases the use of a single measurement radiation wavelength can result in more reproducible overlay measurements compared to using two different measurement radiation wavelengths. In particular, in the example shown in FIG. 19, the overlay sensitivity is negative for the whole range of possible measurement radiation wavelengths. This makes it impossible to select appropriate measurement radiation wavelengths that result in measurement results that are both far from the origin and in different directions from the origin in the type of graph shown in FIG. 18. Whether or not the use of two different measurement radiation wavelengths is better than a single measurement radiation wavelength depends on the amount of feature asymmetry in the target and the relationship between the overlay sensitivity and the possible measurement radiation wavelengths.

Although the principles above have been described with reference to overlay sensitivity, these principles are equally applicable to other measurement quality parameters such as stack sensitivity and diffraction efficiency. Stack sensitivity can be understood as a measure of how much the intensity of the signal changes as overlay changes because of diffraction between target (e.g. grating) layers. That is, in an overlay context, it detects the contrast between upper and lower periodic structures of an overlay target and thus represents a balance between diffraction efficiencies between the upper and lower periodic structures. The diffraction efficiency is directly proportional to the mean intensity of a measurement being diffracted by the target.

Figure 20:
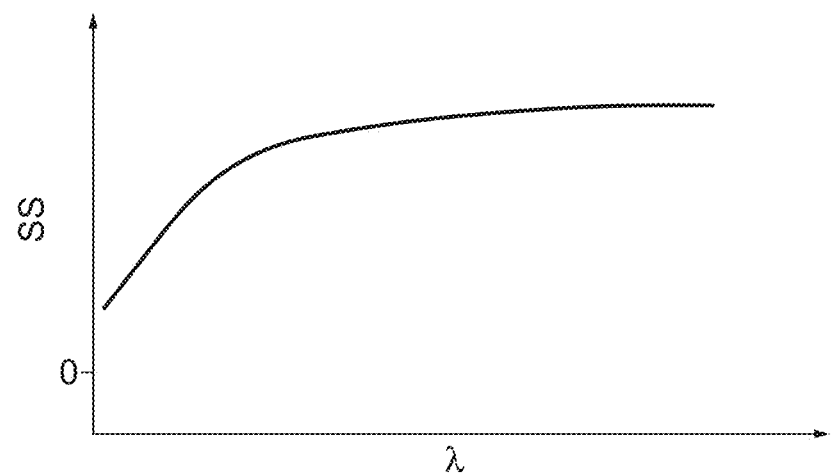
FIG. 20 is a graph showing the relationship between the measurement radiation wavelength and stack sensitivity.

FIG. 20 is a graph showing the relationship between the measurement radiation wavelength and the stack sensitivity. As for the overlay sensitivity, it is desirable for the measurement radiation wavelengths to be selected such that the stack sensitivity values are large and oppositely signed. However, as shown in FIG. 20, in some cases the stack sensitivity may have the same sign (positive in the example of FIG. 20) for the whole range of measured radiation wavelengths. As a result, it may not be possible to select two measurement radiation wavelengths such that the stack sensitivity values are large and oppositely signed.

In an embodiment, the present invention provides a method to determine a patterning process parameter. In the following description, the invention will be described with reference to overlay being the patterning process parameter. However, the present invention can be used to determine other patterning process parameters such as the CD of a structure.

As explained above, the present inventors have found that in some cases the use of two different measurement radiation wavelengths is better than using a single measurement radiation wavelength. This is because using two different measurement radiation wavelengths can improve the robustness of the overlay measurement with respect to undesirable feature asymmetry in the target. However, in other cases the use of a single measurement radiation wavelength is better than use of two different measurement radiation wavelengths because there is less noise that influences the overlay measurement.

In an embodiment, both single-wavelength and multiple-wavelength measurements are used in order to determine the overlay. The present invention is expected to achieve the benefits of both single-wavelength and multiple-wavelength measurements. In particular, an embodiment of the invention is expected to improve robustness of measurements with respect to feature asymmetry in the target. Meanwhile, an embodiment of the invention is expected to achieve a reduction in noise in the measurements. In an embodiment, single-wavelength and multiple-wavelength measurements can be mixed so as to provide an improved hybrid measurement.

In an embodiment the target is illuminated with radiation comprising two different central wavelengths. In other words, two different measurement radiation wavelengths are used to illuminate the target and obtain raw data. Of course, when a certain measurement radiation wavelength is selected and used, the illuminating radiation may in practice comprise a spectrum of wavelengths with a peak at a certain central wavelength. In this description, when a particular measurement radiation wavelength is used, we refer to the target being illuminated with radiation comprising a central wavelength.

Based on the raw data obtained from illuminating the target with the radiation comprising two different central wavelengths, calculations are performed so as to provide a combined measurement for the overlay.

In an embodiment, the method comprises, for a target, calculating a first value for an intermediate parameter from data obtained by illuminating the target with radiation comprising a central wavelength. In the description below, the invention will be described with reference to overlay being the intermediate parameter. However, other intermediate parameters can be used such as intensity level or asymmetry level.

When the intermediate parameter is overlay, a first value for the overlay is calculated from data obtained by illuminating the target with radiation comprising a (single) central wavelength. In other words, the overlay is calculated based on using a single measurement radiation wavelength.

In an embodiment, the method comprises, for the target, calculating a second value for the intermediate parameter from data obtained by illuminating the target with radiation comprising two different central wavelengths. In the context of the intermediate parameter being overlay, the method comprises calculating a second overlay value based on using two different measurement radiation wavelengths. Hence, the first value is a single-wavelength overlay measurement and the second value is a multiple-wavelength overlay measurement.

In an embodiment, the method comprises calculating a combined measurement for the patterning process parameter (e.g. overlay) based on the first and second values for the intermediate parameter. The combined measurement may have the benefits of both single-wavelength measurements and multiple-wavelength measurements.

In an embodiment, the combined measurement is determined according to a function that depends on a measure of structural asymmetry of features within a periodic structure in an upper and/or lower layer of the target. As explained above, a particular advantage of multiple-wavelength measurements is the increased robustness with respect to structural asymmetry of features within the target. By determining the combined measurement according to a function that depends on a measure of the feature asymmetry, the benefits of reproducibility and accuracy of overlay measurements can be balanced. The multiple-wavelength measurement can have a greater influence when the feature asymmetry is greater so as to improve robustness of the combined overlay measurement when this is more important. Meanwhile, when structural asymmetry of features is low, it may desirable to base the combined measurement more on the single-wavelength measurement so as to reduce the noise in the combined measurement.

In an embodiment, the function depends on the measure of structural asymmetry such that when the structural asymmetry is greater, the second value (i.e. the multiple-wavelength measurement) has a greater influence on the combined measurement.

It can be difficult to determine to what extent there is unwanted structural asymmetry of features within the targets. There are several different ways to measure the structural asymmetry. The present invention can be used with any of them.

One way to obtain a measure of the structural asymmetry is to determine the difference between the multiple-wavelength overlay measurement and the single-wavelength overlay measurement. Hence, the asymmetry parameter on which to decide to move from single-wavelength to multiple-wavelength measurements can be the difference between the overlay measured using a single wavelength operation and the overlay measured using a multiple-wavelength operation.

An advantage of using the difference between the multiple-wavelength and single-wavelength overlay measurements as the measure for feature asymmetry is that additional measurement time is not required. Hence, in an embodiment when the intermediate parameter is overlay, the measure of structural asymmetry is proportional to a difference between the first overlay value and the second overlay value.

There are other ways to determine the asymmetry parameter. For example, as explained above the feature asymmetry effect can be indicated by the distance 1860 of the line 1850 from the origin in FIG. 18.

In an alternative embodiment, the measure of structural asymmetry is measured from a structural asymmetry target (i.e. a dedicated target) that corresponds to a periodic structure in an upper or lower layer of the target. A plurality of such dedicated targets may be positioned across the substrate. Each dedicated target comprises a grating that corresponds to only the periodic structure in the lower layer of the targets used for measuring the overlay. The dedicated target has only the bottom grating and no top grating. As a result, when the intensity imbalance is measured from the dedicated target, the imbalance is related to the unwanted feature asymmetry. Hence, the feature asymmetry can be measured in this way using dedicated targets.

In a further alternative embodiment, the measure of structural asymmetry is measured from a lower layer of the target before an upper layer of the target is formed. In the manufacture of the target, the periodic structure in the lower layer is formed first. Later, the periodic structure in the upper layer is formed. By measuring the intensity imbalance before the periodic structure in the upper layer is formed, the feature asymmetry in the lower layer can be measured.

In an embodiment, the central wavelength from which the first value is calculated is one of the two different central wavelengths from which the second value is calculated. An embodiment of the invention is expected to minimise the measurement time required to produce the combined measurement. It is not necessary to use three different measurement radiation wavelengths. The single wavelength can be one of the two different wavelengths used.

In an alternative embodiment, the central wavelength from which the first value is calculated is different from the two different central wavelengths from which the second value is calculated. Hence, it is possible for three different wavelengths to be used. This may allow the single wavelength to be selected so as to optimise a different parameter from the selection of the two different wavelengths.

In an embodiment, the method is performed for a plurality of targets across a substrate. In an embodiment, the combined measurement is determined according to a function such that for targets that are further from a centre of the substrate, the second value (i.e. the value obtained from a multiple-wavelength measurement) has a greater influence on the combined measurement.

In general, in the centre of the substrate, the feature asymmetry impact may be low. Accordingly, in the centre of the substrate, it may be more desirable for the single-wavelength measurement to influence the combined measurement. This is because the reproducibility of the single-wavelength measurement can be higher than the multiple-wavelength measurement (depending on the overlay sensitivity for the measurement radiation wavelengths used). On the other hand, at the edges of the substrate, it may be desirable to use the multiple-wavelength more. This is because at the edges of the substrate, the feature asymmetry impact may be larger.

In an embodiment, the function according to which the combined measurement is determined is a continuous function. This can provide continuous mixing of the single-wavelength and multiple-wavelength measurements. The function depends on the amount of feature asymmetry present.

One way to determine the combined measurement based on the first and second values is set out below.

$$OV_{combined} = OV_1 + \frac{x^2}{x^2 + 1}(OV_2 - OV_1)$$

In the above equation, OVcombined is the combined measurement for the overlay. OV1 is the first value (i.e. from a single-wavelength measurement) for the overlay. OV2 is the second value (i.e. from a multiple-wavelength measurement) for the overlay. The mixing factor (M in FIG. 22) is $$\frac{x^2}{x^2 + 1}.$$

The mixing factor M depends on the measure of structural asymmetry x.

The parameter x is a measure of structural asymmetry. In an embodiment, the parameter x may be calculated using the formula below:

$$x = \frac{(OV_2 - OV_1)}{\text{strength}}$$

In the formula above, the strength parameter is used to tune how strong the asymmetry impact is weighed. The strength parameter can be calibrated so as to provide a desirable function for determining the combined measurement.

Other ways of determining the combined measurement are possible. For example, a tan h function can be used. A tan h function can be used to provide a smooth transition between using solely the first value and solely the second value.

In the formula provided above for OVcombined, the first and second values are mixed (i.e. combined) by combining the first and second overlay values directly. This is because the intermediate parameter is overlay. However, the mixing can alternatively be done at different levels. For example, rather than mixing the overlay values directly, it is possible to mix at intensity or asymmetry level. Hence, the intermediate parameter can be varied accordingly.

Figure 21:
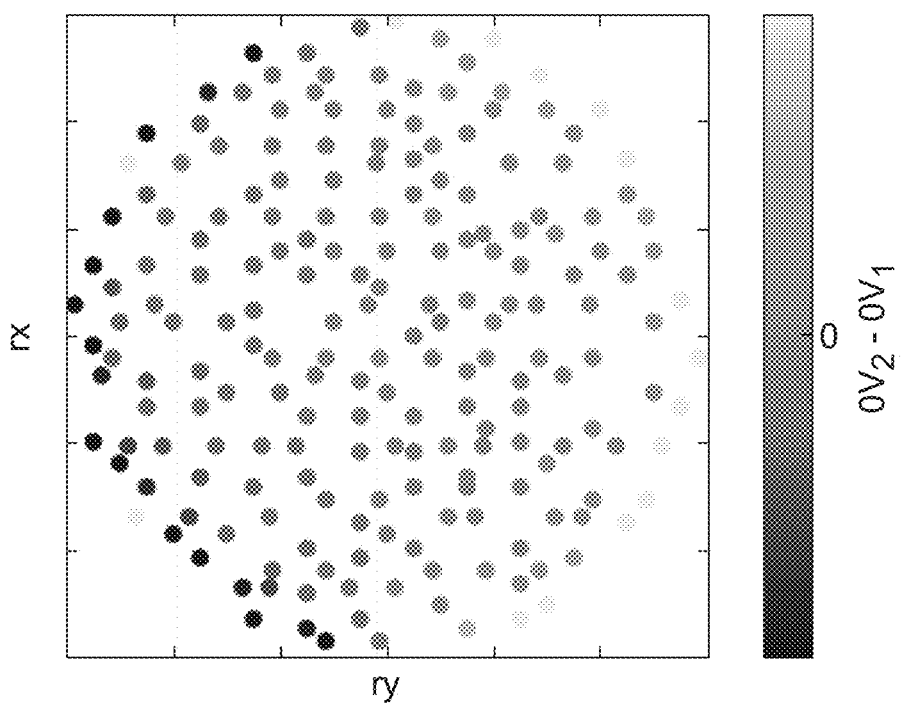
FIG. 21 is a schematic diagram showing the relationship between position on a substrate and the difference between the single-wavelength and multiple-wavelength overlay values.

FIG. 21 is a schematic diagram showing the relationship between position on a substrate and the difference between the first and second overlay values. The substrate is roughly circular. The position on the substrate in the x and y directions are shown by the parameters rx and ry in FIG. 21. As shown in FIG. 21, there is a small difference (indicating low feature asymmetry) between the first and second overlay values in the centre of the substrate. However, at the edges of the substrate, there is a greater magnitude of difference between the first and second overlay values. This indicates that there is greater feature asymmetry at the edges of the substrate.

Figure 22:
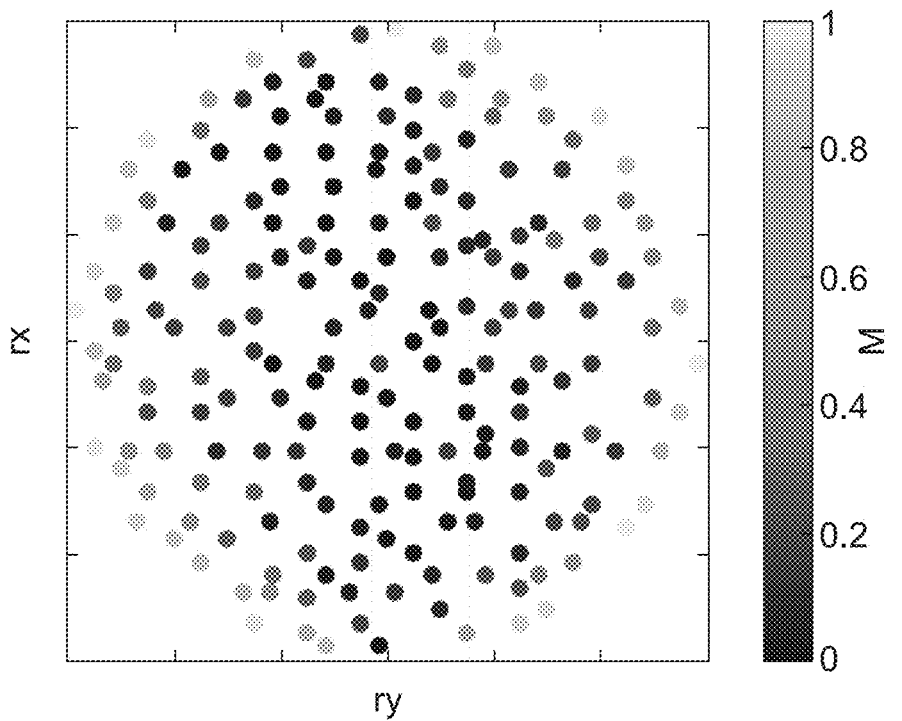
FIG. 22 is a schematic diagram showing the relationship between position on the substrate and how single-wavelength and multiple-wavelength measurements can be mixed according to an embodiment of the present invention.

FIG. 22 is a schematic diagram showing the relationship between the position on the substrate and the mixing factor M. The mixing factor is represented by the letter M in the scale on the right hand side of FIG. 22. As shown in FIG. 22, the mixing factor M is low in the centre of the substrate. This means that the combined measurement will be close to the first value in the centre of the substrate. This is appropriate because it is desirable for the single-wavelength measurement to dominate in the centre of the substrate where feature asymmetry is low. Meanwhile, the mixing factor is higher at the edges of the substrate. This means that the multiple-wavelength measurement dominate where the feature asymmetry is high. As a result, a good balance between reproducibility and accuracy can be achieved.

The present invention can be embodied in a metrology apparatus to determine a patterning process parameter following performance of a lithographic process. The metrology apparatus is operable to perform the method described above.

The present invention can be embodied in a system comprising an inspection apparatus configured to provide a beam of radiation on a target and to protect radiation diffracted by the target. The system comprises software for performing the method of the invention.

In an embodiment, the target has a first biased target structure and a second differently biased target structure, created using a patterning process. In an embodiment, the target is a metrology target.

In an embodiment, the measure of structural asymmetry is calculated from A1+, A2+, A1− and A2−. A1+ is an intensity of positive 1st order radiation reflected from the first biased target structure when the first biased target structure is illuminated by radiation of a first wavelength of the two different wavelengths subtracted from an intensity of negative 1st order radiation reflected from the first biased target structure when the first biased target structure is illuminated by radiation of the first wavelength. A2+ is an intensity of positive 1st order radiation reflected from the first biased target structure when the first biased target structure is illuminated by radiation of a second wavelength of the two different wavelengths subtracted from an intensity of negative 1st order radiation reflected from the first biased target structure when the first biased target structure is illuminated by radiation of the second wavelength. A1− is an intensity of positive 1st order radiation reflected from the second biased target structure when the second biased target structure is illuminated by radiation of the first wavelength subtracted from an intensity of negative 1st order radiation reflected from the second biased target structure when the second biased target structure is illuminated by radiation of the first wavelength. A2− is an intensity of positive 1st order radiation reflected from the second biased target structure when the second biased target structure is illuminated by radiation of the second wavelength subtracted from an intensity of negative 1st order radiation reflected from the second biased target structure when the second biased target structure is illuminated by radiation of the second wavelength.

In an embodiment, when the second value is calculated, a product of A1+ and A2+ is greater than or equal to 0 and/or a product of A1− and A2− is greater than or equal to 0, wherein. A1+ is an intensity of positive 1st order radiation reflected from the first biased target structure when the first biased target structure is illuminated by radiation of a first wavelength of the two different wavelengths subtracted from an intensity of negative 1st order radiation reflected from the first biased target structure when the first biased target structure is illuminated by radiation of the first wavelength. A2+ is an intensity of positive 1st order radiation reflected from the first biased target structure when the first biased target structure is illuminated by radiation of a second wavelength of the two different wavelengths subtracted from an intensity of negative 1st order radiation reflected from the first biased target structure when the first biased target structure is illuminated by radiation of the second wavelength. A1− is an intensity of positive 1st order radiation reflected from the second biased target structure when the second biased target structure is illuminated by radiation of the first wavelength subtracted from an intensity of negative 1st order radiation reflected from the second biased target structure when the second biased target structure is illuminated by radiation of the first wavelength. A2− is an intensity of positive 1st order radiation reflected from the second biased target structure when the second biased target structure is illuminated by radiation of the second wavelength subtracted from an intensity of negative 1st order radiation reflected from the second biased target structure when the second biased target structure is illuminated by radiation of the second wavelength.

An alternative embodiment of the invention will be described with reference to FIG. 23. In an embodiment, the method comprises calculating a measurement for the patterning process parameter (e.g. overlay) for each of a plurality of targets across a layer of a substrate W.

In the alternative embodiment, for at least one of the targets the measurement is calculated from data obtained by illuminating the target with radiation comprising a (single) central wavelength. In other words, the overlay is calculated based on using a single measurement radiation wavelength. For at least one of the other targets the measurement is calculated from data obtained by illuminating the target with radiation comprising two different central wavelengths. In other words, the overlay is calculated based on using a multiple-wavelength overlay measurement.

This alternative embodiment is different from what was previously known. Previously, either single-wavelength overlay measurement or multiple-wavelength overlay measurement was used throughout the whole of a substrate layer. In contrast, according to the embodiment of the invention, a single-wavelength overlay measurement is used for at least one target and a multiple-wavelength overlay measurement is used for at least one target within the same layer of the substrate W.

An embodiment of the invention is expected to achieve an improvement in the quality of measurement of overlay (or a different patterning processes parameter). By using a single-wavelength overlay measurement for some targets and a multiple-wavelength overlay measurement for other targets, the best type of measurement for each target can be chosen so as to improve the quality of the measurements.

In an embodiment the targets are categorised into groups depending on whether a single-wavelength overlay measurement or a multiple-wavelength overlay measurement is to be used. The targets can be further categorised depending on which actual value for the wavelength (or wavelengths) is to be used in the overlay measurement.

For example, in an embodiment for each of a plurality of regions of the substrate layer, the type of data from which to calculate the overlay measurement for targets in the region is selected. For at least one of the regions the selected type of data is data obtained by illuminating the target with radiation comprising a (single) central wavelength (i.e. for a single-wavelength overlay measurement). For at least one other of the regions the selected type of data is data obtained by illuminating the target with radiation comprising two different central wavelengths (i.e. for a multiple-wavelength overlay measurement).

Figure 23:
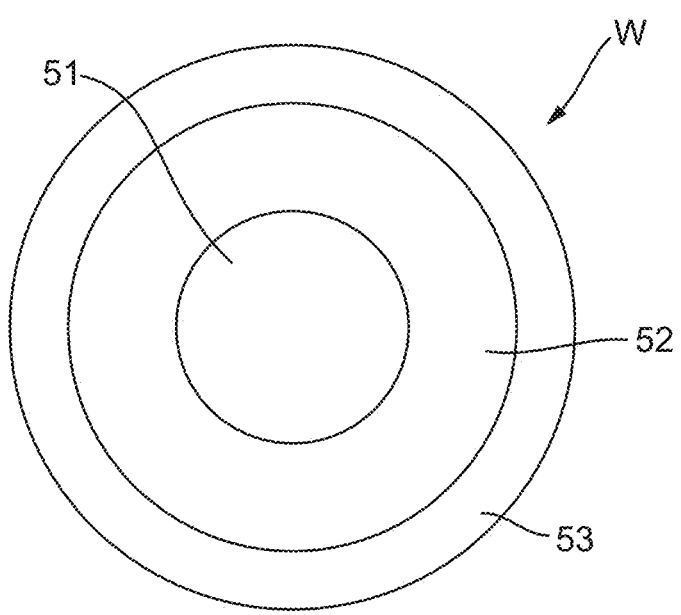
FIG. 23 is a schematic diagram showing a layer of a substrate divided into regions.

FIG. 23 schematically depicts a layer of a substrate W divided into different regions 51, 52, 53. A different type of overlay measurement can be used for the different regions. Each region comprises at least one target for which the overlay is to be measured.

For example, in an embodiment in the central region 51 a single-wavelength overlay measurement is performed using a first wavelength of radiation. For the intermediate region 52, a single-wavelength overlay measurement may be used. The central wavelength may be the same as or different from the first wavelength used in the overlay measurement for targets in the central region 51. In the peripheral region 53, a multiple-wavelength overlay measurement may be used. The multiple-wavelength overlay measurement may be performed using two different central wavelengths. The two different central wavelengths may be different from the wavelengths used in measuring the overlay for targets in the central region 51 and the intermediate region 52. Alternatively, one of the two central wavelengths used in the peripheral region 53 may be the same as the central wavelength used in one or both of the central region 51 and the intermediate region 52.

In an embodiment the regions 51, 52, 53 correspond to different distances from the centre of the substrate W. Merely as an example, if the radius of the substrate W is 150 mm, then the central region 51 may have a radius of 70 mm, the intermediate region 51 may have a radius of 120 mm and the peripheral region 53 may have a radius of 150 mm (i.e. the same as the radius of the substrate W). Of course these values are merely exemplary and other values can be chosen. Furthermore, the number of regions is not particularly limited and may be two, four or more.

In an embodiment, each layer of the substrate W to be exposed is divided into regions as shown in FIG. 23. In an embodiment, the regions are defined in the same way for the different layers. For example, each layer may have a central region 51 having a first radius, an intermediate region 52 having a second radius and a peripheral region 53 having a third radius. Alternatively, the radii of the regions may be different for different layers of the substrate W. Different layers may have different numbers of regions.

For different layers, the types of data and the wavelengths used for the overlay measurement may be different. For example, for a first layer the central region 51 corresponds to a single-wavelength overlay measurement using a first central wavelength and the central region 51 of a second layer corresponds to a single-wavelength measurement using a different central wavelength. In an embodiment the intermediate region 52 of the first layer corresponds to a single-wavelength overlay measurement using a first central wavelength and the intermediate region 52 of a second layer corresponds to a multiple-wavelength overlay measurement using second and third central wavelengths (which may be different from the first central wavelength). In an embodiment the peripheral region 53 of a first layer corresponds to a multiple-wavelength overlay measurement using first and second central wavelengths and the peripheral region 53 of a second layer corresponds to a multiple-wavelength overlay measurement using third and fourth central wavelengths (which may be different from the first and second central wavelengths).

As shown in FIG. 23, in an embodiment the type of data (e.g. whether to use a single-wavelength overlay measurement or a multiple-wavelength overlay measurement) is selected based on a distance between at least one target in the region and the centre of the substrate W. However, different performance indicators can be used as references to divide the substrate W into different regions. For example, in an embodiment the regions are defined based on a measure of structural asymmetry. For example, as explained above there may be a greater amount of structural asymmetry in the peripheral region 53 of the substrate W. Hence, the peripheral region 53 may correspond to targets that have a greater amount of structural asymmetry (e.g. a structural asymmetry greater than a predetermined threshold). The central region 51 may correspond to a region where the targets have a lower structural asymmetry (e.g. a structural asymmetry below a predetermined threshold). The intermediate region 52 may correspond to a region where the targets have an intermediate amount of structural asymmetry.

The structural asymmetry can be measured in various ways as explained above. For example, the structural asymmetry may be determined by calculating the difference between a single-wavelength overlay measurement and a multiple-wavelength overlay measurement of the same targets.

In an embodiment, the targets are categorised based on an alternative parameter such as stack sensitivity or overlay sensitivity.

In an embodiment, the central wavelength (or central wavelengths in the case of a multiple-wavelength overlay measurement) is selected so as to optimise at least one quality parameter for the measurement. The quality parameter may be, for example, stack sensitivity, overlay sensitivity or diffraction efficiency.

The above described embodiments may be combined. For example, a combined measurement using both single-wavelength and dual-wavelength measurements may be used for one or more regions of the substrate W. For example, in an embodiment a single-wavelength measurement is used for the central region 51, a multiple-wavelength overlay measurement is used for the peripheral region 53 and a combined measurement is used for the intermediate region 52.

In an embodiment, the targets may not be grouped into spatial regions as shown in FIG. 23. Alternatively, the targets may be grouped depending only on the measure of structural asymmetry, or other parameters such as stack sensitivity or overlay sensitivity. Hence, a group of targets (which use the same overlay measurement recipe) may be distributed across different parts of the substrate W. Alternatively, the overlay measurement recipe may be selected for each target individually.

According to the present invention it is possible to select the optimal measurement wavelength per region of the substrate W. The optimal wavelength, for example, could be a single wavelength in one region, a dual wavelength in another region, a different dual-wavelength in a further region and so on. This makes it possible for the substrate W to be measured in a more optimal way than previously. An embodiment of the invention is expected to achieve more precise overlay measurements.

As a result of the use of more optimal wavelengths, it is possible to perform lithographic processes more quickly. Previously, it has been necessary to measure the substrate W using a dual wavelength even in the case where only the periphery of the substrate required a dual wavelength measurement (e.g. because of structural asymmetry). According to the present invention, it is possible to measure selectively only the peripheral region 53 of the substrate W using a dual wavelength. The remainder of the substrate W (e.g. the central region 51 and/or the intermediate region 52) can be measured using a single wavelength. An embodiment of the invention is expected to decrease the overlay measurement time for a substrate W. An embodiment of the invention is expected to improve throughput.

Further embodiments according to the invention are further described in below numbered clauses:
16. The system of clause 15, further comprising a lithographic apparatus comprising a support structure configured to hold a patterning device to modulate a radiation beam and a projection optical system arranged to project the modulated radiation beam onto a radiation-sensitive substrate.

Further embodiments according to the invention are further described in below numbered clauses:
I. A method to determine a patterning process parameter, the method comprising:
for each of a plurality of targets across a layer of a substrate, calculating a measurement for the patterning process parameter,
wherein for at least one of the targets the measurement is calculated from data obtained by illuminating the target with radiation comprising a central wavelength, and for at least one other of the targets the measurement is calculated from data obtained by illuminating the target with radiation comprising two different central wavelengths.
II. The method of claim I, comprising:
for each of a plurality of regions of the layer, selecting a type of data from which to calculate the measurement for targets in the region,
wherein for at least one of the regions the selected type of data is data obtained by illuminating the target with radiation comprising a central wavelength, and for at least one other of the regions the selected type of data is data obtained by illuminating the target with radiation comprising two different central wavelengths.
III. The method of claim II, wherein the type of data is selected based on at least one of a distance between at least one target in the region and a centre of the substrate, a measure of structural asymmetry of features within a periodic structure in an upper and/or lower layer of at least one target in the region, stack sensitivity of at least one target in the region and overlay sensitivity of at least one target in the region.
IV. The method of any of claims I-III, further comprising:
when the measurement is to be calculated from data obtained by illuminating the target with radiation comprising a central wavelength, selecting the central wavelength so as to optimize at least one quality parameter for the measurement.
V. The method of any of claims I-III, further comprising:
when the measurement is to be calculated from data obtained by illuminating the target with radiation comprising two different central wavelengths, selecting the central wavelengths so as to optimize at least one quality parameter for the measurement.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams. In an embodiment, the measurement radiation is selected from the range of 400 nm to 950 nm.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:
1. A method to determine a patterning process parameter, the method comprising:
illuminating a target with a first beam of radiation comprising a central wavelength and detecting a first result;
illuminating the target with a second beam of radiation comprising two different central wavelengths and detecting a second result;
calculating a first value for an intermediate parameter based on the first result;
calculating a second value for the intermediate parameter based on the second result; and
calculating a combined measurement for the patterning process parameter based on the first and second values for the intermediate parameter.
2. The method of claim 1, wherein the combined measurement is determined according to a function that depends on a measure of structural asymmetry of features within a periodic structure in one or more of an upper layer of the target and a lower layer of the target.
3. The method of claim 2, wherein the function depends on the measure of structural asymmetry such that when the structural asymmetry is greater, the second value has a greater influence on the combined measurement.

4. The method of claim 2, wherein the intermediate parameter is overlay, and the measure of structural asymmetry is proportional to a difference between the first overlay value and the second overlay value.

5. The method of claim 2, wherein the measure of structural asymmetry is measured from a structural asymmetry target that corresponds to a periodic structure in an upper or lower layer of the target.

6. The method of claim 2, wherein the measure of structural asymmetry is measured from a lower layer of the target before an upper layer of the target is formed.

7. The method of claim 1, wherein the intermediate parameter is overlay, intensity or intensity asymmetry.

8. The method of claim 1, wherein the central wavelength from which the first value is calculated is one of the two different central wavelengths.

9. The method of claim 1, wherein the central wavelength from which the first value is calculated is different from the two different central wavelengths.

10. The method of claim 1, wherein the method is repeated for a plurality of targets disposed on a substrate.

11. The method of claim 10, wherein the combined measurement is determined according to a function such that if the target is further from a center of the substrate, the second value has a greater influence on the combined measurement.

12. The method of claim 1, wherein the patterning process parameter is overlay.

13. A metrology apparatus to determine a patterning process parameter following performance of a lithographic process, the metrology apparatus being operable to perform the method to determine a patterning process parameter, the method comprising:

illuminating a target with a first beam of radiation comprising a central wavelength and detecting a first result;

illuminating the target with a second beam of radiation comprising two different central wavelengths and detecting a second result;

calculating a first value for an intermediate parameter based on the first result;

calculating a second value for the intermediate parameter based on the second result; and calculating a combined measurement for the patterning process parameter based on the first and second values for the intermediate parameter.

14. A non-transitory computer program product comprising machine-readable instructions for causing a processor to cause performance of the method to determine a patterning process parameter, the method comprising:

illuminating a target with a first beam of radiation comprising a central wavelength and detecting a first result;

illuminating the target with a second beam of radiation comprising two different central wavelengths and detecting a second result;

calculating a first value for an intermediate parameter based on the first result;

calculating a second value for the intermediate parameter based on the second result; and calculating a combined measurement for the patterning process parameter based on the first and second values for the intermediate parameter.

15. A system comprising:

an inspection apparatus configured to provide a beam of radiation on a target, and to detect radiation diffracted by the target; and the non-transitory computer program product of claim 14.

* * * * *

UNITED STATES PATENT AND TRADEMARK OFFICE
CERTIFICATE OF CORRECTION

| | | |
|---|---|---|
| PATENT NO. | : 11,300,883 B2 | Page 1 of 1 |
| APPLICATION NO. | : 16/135197 | |
| DATED | : April 12, 2022 | |
| INVENTOR(S) | : Jak et al. | |

It is certified that error appears in the above-identified patent and that said Letters Patent is hereby corrected as shown below:

On the Title Page

On page 2, item (56) References Cited, Column 2, Line 4, replace "TW 1347428 B" with --TW I347428 B--.
On page 2, item (56) References Cited, Column 2, Line 5, replace "TW 1421642 B" with --TW I424642 B--.
On page 2, item (56) References Cited, Column 2, Line 6, replace "TW 1591782 B" with --TW I591782 B--.

Signed and Sealed this
Thirteenth Day of September, 2022

Katherine Kelly Vidal
*Director of the United States Patent and Trademark Office*